United States Patent
Yamamoto

(10) Patent No.: US 10,056,418 B2
(45) Date of Patent: Aug. 21, 2018

(54) IMAGING ELEMENT FOR GENERATING A PIXEL SIGNAL CORRESPONDING TO LIGHT RECEIVING ELEMENTS

(71) Applicant: OLYMPUS CORPORATION, Hachioji-shi, Tokyo (JP)

(72) Inventor: Yusuke Yamamoto, Kawasaki (JP)

(73) Assignee: OLYMPUS CORPORATION, Tokyo (JP)

( * ) Notice: Subject to any disclaimer, the term of this patent is extended or adjusted under 35 U.S.C. 154(b) by 104 days.

(21) Appl. No.: 15/136,523

(22) Filed: Apr. 22, 2016

(65) Prior Publication Data
US 2016/0240573 A1    Aug. 18, 2016

Related U.S. Application Data

(63) Continuation of application No. PCT/JP2014/076032, filed on Sep. 30, 2014.

(30) Foreign Application Priority Data

Oct. 31, 2013   (JP) ................ 2013-226260

(51) Int. Cl.
*H01L 27/146*   (2006.01)
*H04N 9/04*   (2006.01)
(Continued)

(52) U.S. Cl.
CPC ........ *H01L 27/14621* (2013.01); *G02B 5/201* (2013.01); *H04N 9/045* (2013.01); *H04N 9/07* (2013.01)

(58) Field of Classification Search
CPC .... H01L 27/14621; H04N 9/045; H04N 9/07; G02B 5/201
(Continued)

(56) References Cited

U.S. PATENT DOCUMENTS

2013/0057699 A1   3/2013  Ooki
2013/0075607 A1*  3/2013  Bikumandla ..... H01L 27/14632
                                                        250/332
2014/0194748 A1   7/2014  Yamamoto et al.

FOREIGN PATENT DOCUMENTS

JP    2004-56640 A    2/2004
JP    2010-135700 A   6/2010
(Continued)

OTHER PUBLICATIONS

International Search Report dated Dec. 16, 2014, issued in counterpart International Application No. PCT/JP2014/076032 (1 page).

*Primary Examiner* — Lin Ye
*Assistant Examiner* — Chan T Nguyen
(74) *Attorney, Agent, or Firm* — Westerman, Hattori, Daniels & Adrian, LLP

(57) ABSTRACT

An imaging element includes: a first substrate; first light receiving elements regularly disposed on the first substrate; first color filters each of which is disposed on a light receiving surface of the first light receiving elements; a second substrate disposed so that light transmitted through the first substrate is emitted thereto; second light receiving elements regularly disposed on the second substrate; second color filters each of which is disposed on a light receiving surface of the second light receiving elements; and a signal processor which generates a pixel signal corresponding to each of the plurality of first light receiving elements using the first signal and the second signal.

5 Claims, 14 Drawing Sheets

(51) Int. Cl.
*G02B 5/20* (2006.01)
*H04N 9/07* (2006.01)
(58) Field of Classification Search
USPC .......................................................... 348/279
See application file for complete search history.

(56) References Cited

FOREIGN PATENT DOCUMENTS

| JP | 2013-070030 | * | 4/2013 | ............ H04N 5/347 |
| JP | 2013-70030 A | | 4/2013 | |
| JP | 2014-135535 A | | 7/2014 | |

* cited by examiner

FIG. 13

| G | R | G | R |
|---|---|---|---|
| B | G | B | G |
| G | R | G | R |
| B | G | B | G |

FIG. 14

| Y | C | Y | C |
|---|---|---|---|
| M | G | M | G |
| Y | C | Y | C |
| G | M | G | M |

|   | R | G | B |
|---|---|---|---|
| G | 0.11 | 0.86 | 0.08 |
| M | 0.50 | 0.29 | 0.51 |
| C | 0.11 | 0.92 | 0.75 |
| Y | 0.81 | 0.98 | 0.08 |

US 10,056,418 B2

IMAGING ELEMENT FOR GENERATING A PIXEL SIGNAL CORRESPONDING TO LIGHT RECEIVING ELEMENTS

This application is a continuation application based on a PCT International Application No. PCT/JP2014/076032, filed on Sep. 30, 2014, whose priority is claimed on Japanese Patent Application No. 2013-226260, filed Oct. 31, 2013. Both of the content of the PCT International Application and the Japanese Application are incorporated herein by reference.

BACKGROUND OF THE INVENTION

Field of the Invention

The present invention relates to an imaging element.

Description of Related Art

In a general color digital camera, a single-plate imaging element configured with a light receiving element that is two dimensionally arranged thereon is adapted. In such a single-plate color digital camera, a color filter is disposed in font of the light receiving element to obtain a full color image. Types of color filters include an RGB primary color system and a CMYG complementary color system.

Hereinafter, a signal processing method will be described that generates a full color image in which all pixels have RGB color information in an imaging element which a color filter of the primary color system is mounted and in an imaging element on which a color filter of the complementary color system is mounted.

(Imaging Element on Which the Color Filter of the Primary Color System is Mounted)

FIG. 13 is a schematic view illustrating a color arrangement of the color filter of the primary color system, which is referred to as a Bayer array known in the related art. In the illustrated example, a color filter R for transmitting red (R) light, a color filter G for transmitting green (G) light, and a color filter B for transmitting blue (B) light are regularly arranged on a light receiving surface of each pixel. The color filter G accounts for ½ of the total number of pixels. In addition, the color filter R accounts for ¼ of the total number of pixels. Moreover, the color filter B accounts for ¼ of the total number of pixels.

As shown in FIG. 13, since any one of the color filter R, the color filter U and the color filter B is disposed on the light receiving surface of each pixel, the color information of two colors among red, green, and blue is always missing. Therefore, the missing information of the two colors is interpolated based on an output of an adjacent pixel, and demosaicing processing is performed so that each pixel obtains the color information of the three colors of red, blue, and green.

As the demosaicing, processing, two methods are generally known. The first method is a method of performing linear interpolation from an adjacent or nearby pixel.

The second method is a method of calculating a color difference signal after the linear interpolation, determining whether a correlation in a vertical direction or a horizontal direction is stronger, and further performing interpolation processing based on a result of the determination. For example, when the correlation in the vertical direction is stronger, interpolation is further performed with an average value of adjacent pixels in the vertical direction.

(Imaging Element on Which the Color Filter of the Complementary Color System is Mounted)

FIG. 14 is a schematic view illustrating a color arrangement of the color filter of the complementary color system, which is referred to as a color difference sequential system known in the related art. In an illustrated example, a color filter C for transmitting cyan light C, a color filter M for transmitting magenta light M, a color filter Y for transmitting yellow light Y, and a color filter G for transmitting green light G are regularly arranged on the light receiving surface of each pixel. Cyan (C) is the complementary color (=Blue (B)+Green (G)) of red (R). Magenta (M) is the complementary color (=Blue (B)+Red (R)) of green (G). Yellow (Y) is the complementary color (=Green (G)+Red (R)) of blue (B).

FIG. 15 is a graph which shows transmission characteristics of the color filter C, the color filter M, the color filter Y and the color filter G known in the related art. The horizontal axis of the graph shows a wavelength λ (nm). The vertical axis of the graph shows relative spectral sensitivity. As shown in FIG. 15, a curve 2501 shows transmission characteristics of the color filter C. A curve 2502 shows transmission characteristics of the color filter M. A curve 2503 shows transmission characteristics of the color filter Y. A curve 2504 shows transmission characteristics of the color filter G Hereinafter, description will return to FIG. 14 As shown in FIG. 14, since any one of the color filter C, the color filter M, the color filter Y, and the color filter G is disposed on the light receiving surface of each pixel, the color information of three colors among cyan, magenta, yellow, and green is always missing in each pixel. In the complementary color system, conversion is performed in the following manner (for example, refer to Japanese Unexamined Patent Application, First Publication No. 2004-56640) to obtain an RGB image to be displayed on a color television from a captured CMYG image.

First, the color information of all of CMYG in each pixel is calculated using the CMYG color information obtained one by one by each pixel. In a calculation method, linear interpolation and the like are performed. Then, the CMYG color information is converted into the RGB color information of each pixel. The transmittance of each color component of RGB transmitted through each color filter of CMYG is a parameter determined by the transmission characteristics of CMYG during manufacture.

FIG. 16 is a schematic view illustrating an example of the transmittance of each color component of RGB transmitting each color filter of CMYG known in the related art.

In the illustrated example, the transmittance of red light transmitted through the color filter G is 0.11, the transmittance of green light transmitted through the color filter G is 0.86, and the transmittance of blue light transmitted through the color filter G is 0.08. In addition, the transmittance of red light transmitted through the color filter M is 0.50, the transmittance of green light transmitted through the color filter M is 0.29, and the transmittance of blue light transmitted through the color filter M is 0.51. Moreover, the transmittance of red light transmitted through the color filter C is 0.11, the transmittance of green light transmitted through the color filter C is 0.92, and the transmittance of blue light transmitted through the color filter C is 0.75. Furthermore, the transmittance of red light transmitted through the color filter Y is 0.81 the transmittance of green light transmitted through the color filter Y is 0.98, and the transmittance of blue light transmitted through the color filter Y is 0.08.

When the transmittance of each color component of RGB transmitted through each color filter of CMYG is as shown in FIG. 16, color information conversion from CMYG into RGB in each pixel can be performed using a matrix operation (color matrix conversion) shown in the following Equation (1).

$$\begin{pmatrix} R \\ G \\ B \end{pmatrix} = \begin{pmatrix} -0.61 & 0.88 & -0.62 & 0.86 \\ 0.79 & -0.60 & 0.30 & 0.22 \\ -0.54 & 0.89 & 0.85 & -0.59 \end{pmatrix} \begin{pmatrix} G \\ M \\ C \\ Y \end{pmatrix} \quad (1)$$

It is possible to perform conversion from the CMYG color information into the RGB color information by performing the above-described operation.

SUMMARY OF INVENTION

According to a first aspect of the present invention, an imaging element includes: a first substrate; a plurality of first light receiving elements which are regularly disposed on the first substrate and output a first signal corresponding to an intensity of emitted light; a plurality of first color filters each of which is disposed on a light receiving surface of the first light receiving elements, and allow light in a first wavelength band including at least a second wavelength band and a third wavelength band to be transmitted; a second substrate which is disposed so that light transmitted through the first substrate is emitted thereto; a plurality of second light receiving elements which are regularly disposed on the second substrate and output a second signal corresponding to the intensity of the emitted light; a plurality of second color filters each of which is disposed on a light receiving surface of the second light receiving elements, and allow light in the second wavelength band to be transmitted; and a signal processor which generates a pixel signal corresponding to each of the plurality of first tight receiving elements using the first signal and the second signal.

According to a second aspect of the present invention, in the imaging element of the first aspect, when the first wavelength band is a wavelength band of magenta (M) light in a CMS complementary color system with respect to an RGB color system, the third wavelength band may be a wavelength band of blue (B) light in the RGB color system. When the first wavelength band is a wavelength band of yellow (Y) light in the CMY complementary color system with respect to the RGB color system, the third wavelength band may be a wavelength band of green (G) light in the RGB color system. The second wavelength band may be a wavelength band of red (R) light in the RGB color system.

According to a third aspect of the present invention, the imaging element of the first aspect may further include: a plurality of third light receiving elements which are regularly disposed on the first substrate and output a third signal corresponding to the intensity of emitted light; a plurality of third color filters each of which is disposed on a light receiving surface of the third light receiving elements and allow light in a fourth wavelength band including at least a fifth wavelength band to be transmitted; a plurality of fourth light receiving elements which are regularly disposed on the second substrate and output a fourth signal corresponding to the intensity of emitted light; and a plurality of fourth color filters each of which is disposed on a light receiving surface of the fourth light receiving elements and allow light in the fifth wavelength band to be transmitted, wherein the signal processor generates the pixel signal corresponding to each of the plurality of third light receiving elements using the third signal and the fourth signal.

According to a fourth aspect of the present invention, in the imaging element of the third aspect, the fourth wavelength band may be a wavelength band of cyan (C) light or a wavelength band of yellow (Y) light in the CMY complementary color system with respect to the RGB color system, and the fifth wavelength band may be a wavelength band of green (G) light in the RGB color system.

According to a fifth aspect of the present invention, in the imaging element of the third aspect, the fourth wavelength band may be the same as the fifth wavelength band.

According to a sixth aspect of the present invention, in the imaging element of the first aspect, a light receiving area on the light receiving surface of the second light receiving elements may be larger than a light receiving area on the light receiving surface of the first light receiving elements, and the plurality of second light receiving elements may be disposed in one-to-one correspondence with the plurality of first light receiving elements.

BRIEF DESCRIPTION OF THE DRAWINGS

FIG. 13 is a schematic view illustrating the color arrangement of a color filter of a primary color system, which is referred to as a Bayer array known in the related art.

FIG. 14 is a schematic view illustrating the color arrangement of a color filter of a complementary color system which is referred to as a color difference sequential system known in the related art.

DETAILED DESCRIPTION OF THE INVENTION (First Embodiment)

Figure 1:
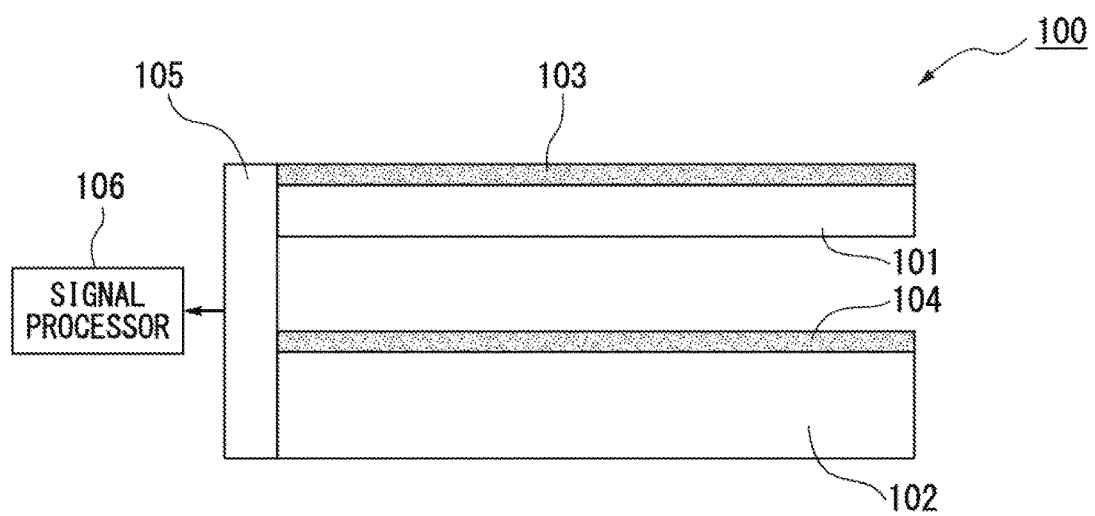
FIG. 1 is a cross-sectional view illustrating the cross-section of an imaging element according to a first embodiment of the present invention.

Hereinafter, a first embodiment of the present invention will be described with reference to the appended drawings. FIG. 1 is a cross-sectional view illustrating, a cross-section of an imaging element 100 according to the present embodiment. As illustrated in FIG. 1, the imaging element 100 includes a first substrate 101, a second substrate 102, a complementary color filter 103, a primary color filter 104, a connecting section 105, and a signal processor 106. The first substrate 101 includes a plurality of first pixels formed on a silicon chip. The second substrate 102 includes a plurality of second pixels formed on a silicon chip. The complementary color filter 103 is a color filter of a CMY complementary color system with respect to an RGB color system.

The plurality of pixels in the first substrate 101 include a photoelectric conversion element (first light receiving element) and a signal reading circuit. The plurality of second pixels in the second substrate 102 include a photoelectric conversion element (second light receiving element) and the signal reading circuit. The photoelectric conversion element outputs a signal charge corresponding to the amount of exposure to a circuit for reading a signal charge. The signal reading circuit outputs a signal charge as an electrical signal. The complementary color filter 103 is formed on a light receiving surface side of the first substrate 101. The arrangement of the complementary color filter 103 will be described below. The primary color filter 104 is formed on a light receiving surface side of the second substrate 102. The arrangement of the primary color filter 104 will be described below.

The first substrate 101 and the second substrate 102 are stacked. In the illustrated example, the second substrate 102 is disposed on an opposite side of the light receiving surface of the first substrate 101. The light receiving surface of the second substrate 102 is a side on which the first substrate 101 is present. In addition, the connecting section 105 is configured between the first substrate 101 and the second substrate 102, and the first substrate 101 and the second substrate 102 are electrically connected to each other through the connecting section 105. That is, the first substrate 101 and the second substrate 102 are bonded through the connecting section 105.

Each of the first pixels included in the first substrate 101 obtains a first signal. Each of the second pixels included in the second substrate 102 obtains a second signal. The first signal obtained by the first substrate 101 and the second signal obtained by the second substrate 102 are output to a signal processor 106 through the connecting section 105. The signal processor 106 may be provided on one of the first substrate 101 and the second substrate 102, and may also be provided somewhere other than the first substrate 101 and the second substrate 102. The signal processor 106 uses the first signal and the second signal to generate a pixel signal of each of the first pixels. That is, the signal processor 106 generates a full color image having RGB (red, green, blue) color information.

Here, the first substrate 101 is a rear surface irradiation type imaging substrate, and the first substrate 101 is thin with a thickness of about several µm. To this end, some of light incident from the light receiving surface side of the first substrate 101 is transmitted through the first substrate 101 and is incident on the light receiving surface side of the second substrate 102. The absorption rate of the silicon for light that is incident on the silicon varies depending on a wavelength of the light that is incident on the silicon. The absorption rate of the silicon for light with a short wavelength is high, and the absorption rate of the silicon for light with a long wavelength is low. That is, on the first substrate 101 which is thin, most of the light with a short wavelength is absorbed, but part of the light with a long wavelength is not absorbed and is transmitted through the first substrate 101. For example, in the present embodiment, the thickness of the first substrate 101 is about 3 µm. In this case, some of light with a wavelength of 500 nm or more (light of a high wavelength side among green (G) light, red (R) light, and infrared IR light) is not absorbed and is transmitted through the first substrate 101. In addition, the second substrate 102 is a front surface irradiation type imaging substrate, and is thicker than the first substrate 101. Therefore, the light transmitted through the first substrate 101 is detected in the second substrate 102.

Figure 2:
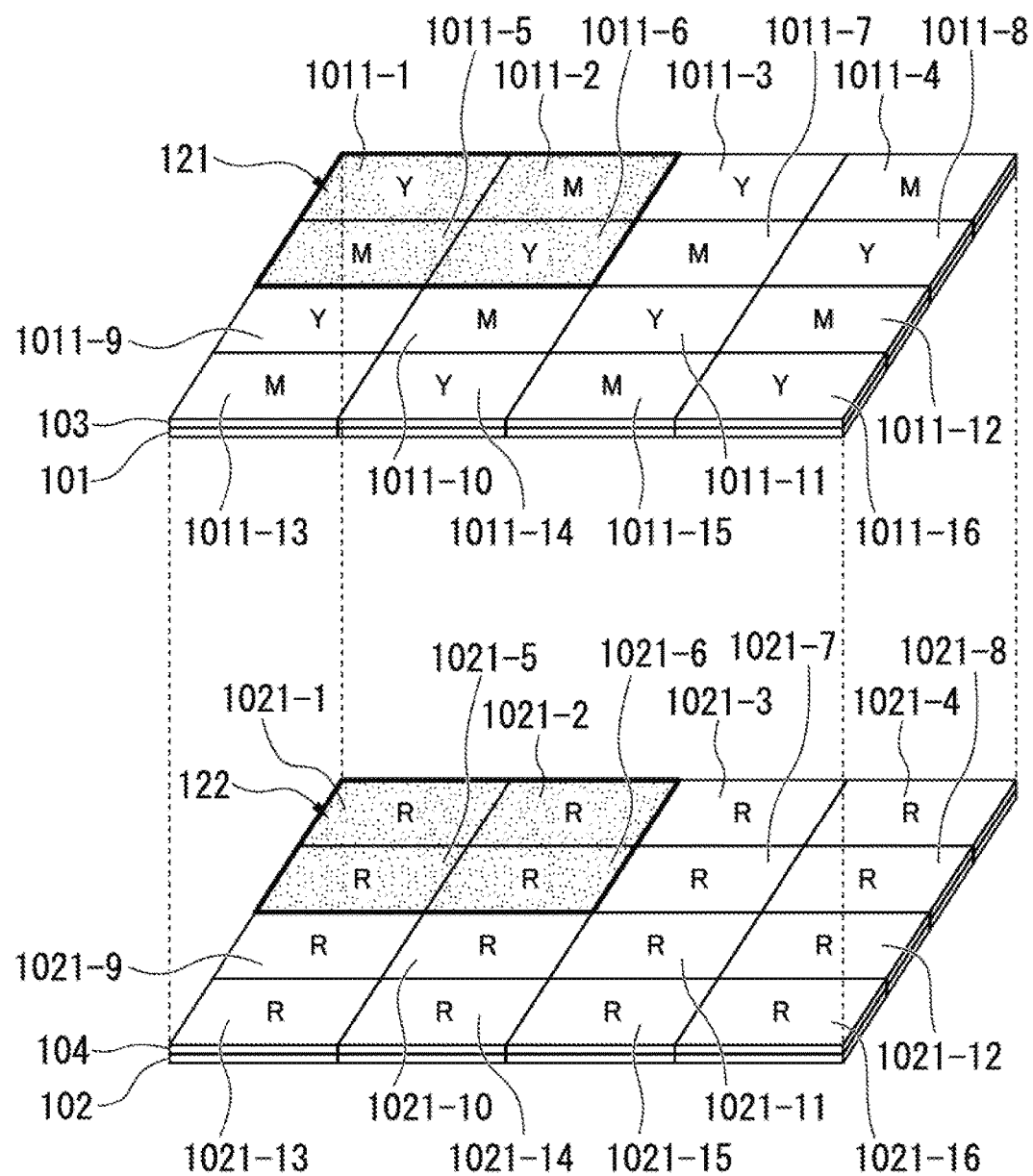
FIG. 2 is a schematic view illustrating the arrangement of a complementary color filter and the arrangement of a primary color filter according to the first embodiment of the present invention.

FIG. 2 is a schematic view illustrating the arrangement of the complementary color filter 103 and the arrangement of the primary color filter 104 according to the first embodiment of the present invention. As shown in FIG. 2, a total of 16 of the first pixels 1011-1 to 1011-16 (the first light receiving element) which are regularly arranged in a two dimensional shape of four rows and four columns are included in the first substrate 101. In addition, a total of 16 of the second pixels 1021-1 to 1021-16 (the second light receiving element) which are regularly arranged in a two dimensional shape of four rows and four columns are included in the second substrate 102. The number and the arrangement of the first pixels 1011 included in the first substrate 101 and the second pixels 1021 included in the second substrate 102 are not limited to the illustrated example, but may be any number and arrangement.

The complementary color filter 103 formed on the first substrate 101 is a filter in which a plurality of color filters (the first color filter) such as color filters M for transmitting magenta (M) (=B+R) light and color filters Y for transmitting yellow (Y) (=G+R) light are arranged. The color filters Y for transmitting yellow (Y) light are formed in the first pixels 1011-1, 1011-3, 1011-6, 1011-8, 1011-9, 1011-11, 1011-14, and 1011-16. The color filters M for transmitting magenta (M) light are formed in the first pixels 1011-2, 1011-4, 1011-5, 1011-7, 1011-10, 1011-12, 1011-13, and 1011-15.

In addition, four of the first pixels 1011 vertically and horizontally adjacent to each other are set to be a set of a unit pixel region 121. For example, the set of the unit pixel region 121 is configured of two first pixels 1011-2 and 1011-5 in which the color filters M for transmitting magenta light are formed, and two first pixels 1011-1 and 1011-6 in which the color filters Y for transmitting yellow light are formed.

The primary color filter 104 formed on the second substrate 102 is a filter in which a plurality of color filters R (the second color filter) for transmitting red (R) light are arranged. The color filters R for transmitting red (R) light are formed in the second pixels 1021-1 to 1021-16.

In addition, four of the second pixels 1021 vertically and horizontally adjacent to each other are set to be a set of a unit pixel region 122. For example, the set of the unit pixel region 122 is configured of four pixels 1021-1, 1021-2, 1021-5, and 1021-6 in which the color filters R for transmitting red light are formed.

In addition, the first pixels 1011-1 to 1011-16 included in the first substrate 101 and the second pixels 1021-1 to 1021-16 included in the second substrate 102 are disposed to have a one-to-one correspondence relationship with each other. For example, the first pixel 1011-1 and the second pixel 1021-1 are disposed so that light transmitted through the first pixels 1011-1 is emitted only to the corresponding second. pixel 1021-1. In addition, the first pixel 1011-2 and the second pixel 1021-2 are disposed so that light transmitted through the first pixel 1011-2 is emitted only to the corresponding second pixel 1021-2. In the same manner, the first pixels 1011-3 to 1011-16 and the second pixels 1021-3 to 1021-16 are also disposed as illustrated.

As described above, the first substrate 101 allows the light with a wavelength of 500 inn or more (the light of a high wavelength side among the green (G) light, the red (R) light, and the infrared IR light) to be transmitted. Here, among the red (R) (a second wavelength band) light, the green (G) (a third wavelength band) light, and the blue (B) the third wavelength band) light, the red (R) light is most easily transmitted through the first substrate 101.

The light, which has transmitted through the first substrate 101, with a wavelength of 500 nm or more is emitted to the second substrate 102. Accordingly, in the embodiment, only the color filters R for transmitting red (R) light are used in the primary color filter 104 formed on the second substrate 102 as illustrated in FIG. 2. In addition, the color filter M for transmitting magenta (M) (=B+R) (the first wavelength band) light and the color filter Y for transmitting yellow (Y) (=G+R) (the first wavelength band) light are used in the complementary color filter 103 formed on the first substrate 101 to cause the red (R) light to be transmitted through the second substrate 102.

In this configuration, the first signal obtained by the first substrate 101 is a signal M corresponding to the intensity of the magenta (M) light and a signal Y corresponding to the intensity of the yellow (Y) light. The second signal obtained by the second substrate 102 is a signal R corresponding to the intensity of the red (R) The signal processor 106 calculates RGB color information of each of the first pixels 1011 with good accuracy using the first signal and the second signal. A method of calculating the RGB color information by the signal processor 106 will be described in detail below.

Next, the operation of the imaging element 100 will be described. In the embodiment, a case of using the imaging element 100 in a digital camera will be described. Light from which infrared light is cut by an infrared light (IR) cut filter is emitted to the imaging element 100.

Light is incident on the light receiving surface side of the first substrate

Each of the first pixels 1011-1 to 1011-16 detects light transmitted through the complementary color filter 103 and outputs a first signal. Specifically, the first pixels 1011-1, 1011-3, 1011-6, 1011-8, 1011-9, 1011-11, 1011-14, and 1011-16 in which the color filters Y for transmitting yellow (Y) light are formed output a first signal corresponding to the intensity of the yellow (Y) light. In addition, the first pixels 1011-2, 1011-4, 1011-5, 1011-7, 1011-10, 1011-12, 1011-13, and 1011-15 in which the color filters M for transmitting magenta (M) light are formed output a first signal corresponding to the intensity of the magenta (M) light.

In addition, each of the second pixels 1021-1 to 1021-16 on the second substrate 102 detects light transmitted through the complementary color filter 103, the first substrate 101, and the primary color filter 104, and outputs a second signal. Specifically, each of the second pixels 1021-1 to 1021-16 in which the color filters R for transmitting red (R) light are formed outputs a second signal corresponding to the intensity of the red (R) light.

The first signal output from the first pixels 1011-1 to 1011-16 and the second signal output from the second pixels 1021-1 to 1021-16 are both output to the signal processor 106 through the connecting section 105. The signal processor 106 generates a full color image having RGB color information of each of the first pixels 1011-1 to 1011-16 using the first signal and the second signal.

Figure 3:
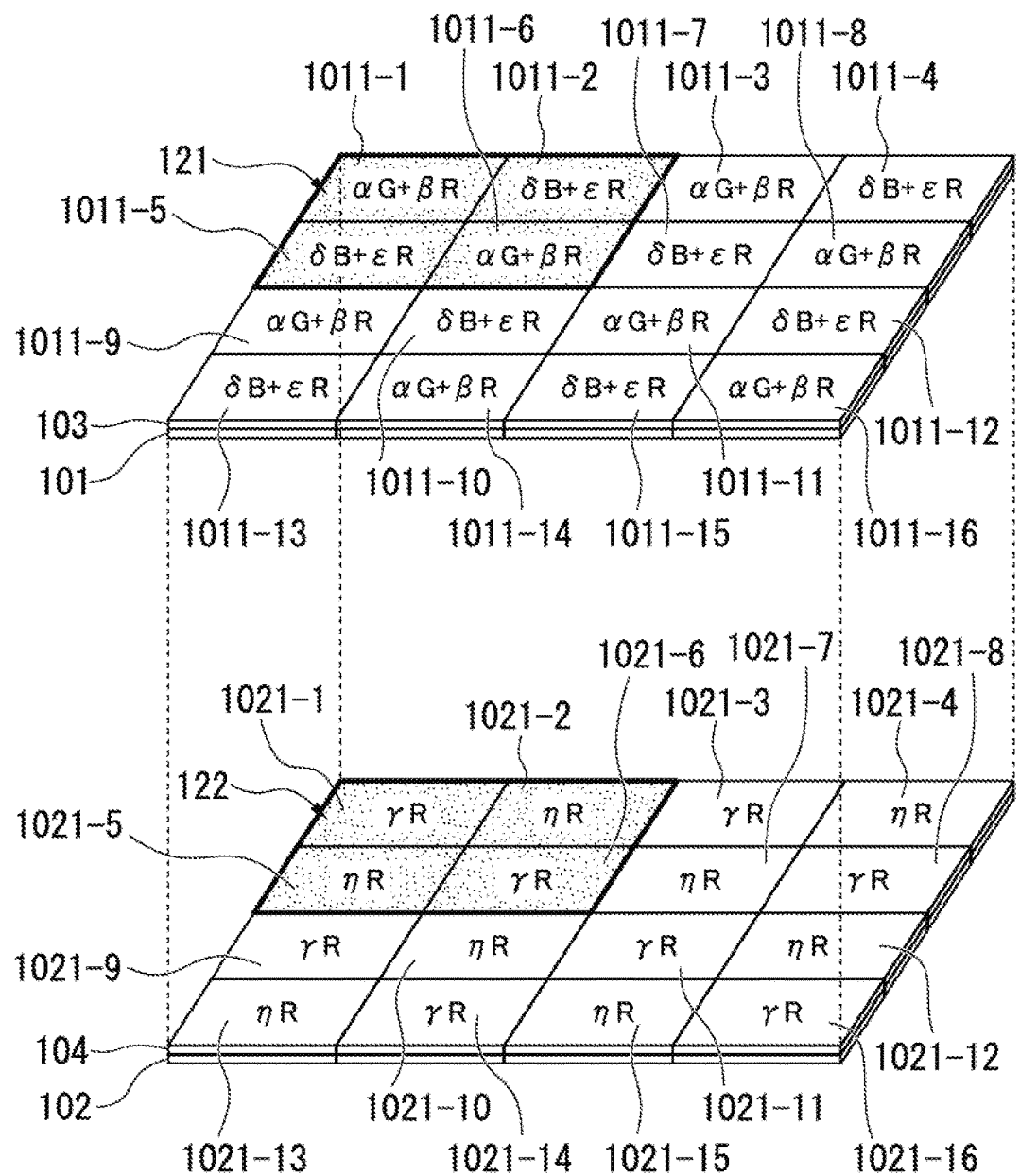
FIG. 3 is a schematic view illustrating a first signal output from a first pixel and a second signal output from a second pixel according to the first embodiment of the present invention.

Then, the first signal output from the first pixels 1011-1 to 1011-16 and the second signal output from the second pixels 1021-1 to 1021-16 will be described. FIG. 3 is a schematic view illustrating the first signal output from the first pixels 1011-1 to 1011-16 and the second signal output from the second pixels 1021-1 to 1021-16 according to the embodiment.

As illustrated in FIG. 3, the unit pixel region 121 configured of the first pixels 1011-1, 1011-2, 1011-5, and 1011-6 is shown on the first substrate 101. In addition, the unit pixel region 122 configured of the second pixels 1021-1, 1021-2, 1021-5, and 1021-6 is shown on the second substrate 102.

As described above, the color filters Y for transmitting yellow (Y) light are formed in the first pixels 1011-1, 1011-3, 1011-6, 1011-8, 1011-9, 1011-11, 1011-14, and 1011-16. Yellow (Y) is the complementary color (=Green (G)+Red (R) of blue (B). Here, the first signal output from the first pixels 1011-1, 1011-3, 1011-6, 1011-8, 1011-9, 1011-11 1011-14, and 1011-16 is set to be $\alpha G+\beta R$. G is a value corresponding to the intensity of the green light. R is a value corresponding to the intensity of the red light. The values of $\alpha$ and $\beta$ are fixed values determined at the time of manufacture of the color filter Y.

Moreover, as described above, the color filters M for transmitting magenta (M) light are formed in the first pixels 1011-2, 1011-4, 1011-5, 1011-7, 1011-10, 1011-12, 1011-13, and 1011-15. Magenta (M) is the complementary color (=Blue (B)+Red (R)) of Green (G), Here, the first signal output from the first pixels 1011-2, 1011-4, 1011-5, 1011-7, 1011-10, 1011-12, 1011-13, and 1011-15 is set to be $\delta B+\varepsilon R$. B is a value corresponding to the intensity of the blue light. R is a value corresponding to the intensity of the red light. The values of $\delta$ and $\varepsilon$ are fixed values determined at the time of manufacture of the color filter M.

In addition, as described above, the color filter R for transmitting red (R) light is formed in the second pixels 1021-1 to 1021-16. Light transmitted through the first pixels 1011-1, 1011-3, 1011-6, 1011-8, 1011-9, 1011-11, 1011-14, and 1011-16 is incident on the second pixels 1021-1, 1021-3, 1021-6, 1021-8, 1021-9, 1021-11, 1021-14, and 1021-16. That is, light transmitted through the color filter Y, the first substrate 101, and the color filter R is incident on the second pixels 1021-1, 1021-3, 1021-6, 1021-8, 1021-9, 1021-11, 1021-14, and 1021-16. Here, the second signal output from the second pixels 1021-1, 1021-3, 1021-6, 1021-8, 1021-9, 1021-11, 1021-14, and 1021-16 is set to be $\gamma R$. R is a value corresponding to the intensity of the red light. The value of γ is a fixed value determined at the time of manufacture of the color filter R.

Moreover, when focusing on the red light transmitted through the first pixels 1011-2, 1011-4, 1011-5, 1011-7, 1011-10, 1011-12, 1011-13, and 1011-15 in which the color filters Y are formed on the first substrate 101, a ratio of β to γ is a parameter determined at the time of manufacture. For example, the ratio of β to γ is determined by transmission characteristics of the color filter Y and the color filter R, or spectral sensitivity of the first substrate 101 and the second substrate 102 determined based on the thickness and the like of the fast substrate 101 and the second substrate 102.

Light transmitted through the first pixels 1011-2 and 1011-5 is incident on the second pixels 1021-2 and 1021-5. That is light transmitted through the color filter M, the first substrate 101, and the color filter R is incident on the second pixels 1021-2 and 1021-5. Here, the second signal output from the second pixels 1021-2 and 1021-5 is set to be ηR is the value corresponding to the intensity of the red light. The value of ηis a fixed value determined at the time of manufacture of the color filter R.

In addition, when focusing on the red light transmitted through the first pixels 1011-2, 1011-4, 1011-5, 1011-7, 1011-10, 1011-12, 1011-13, and 1011-15 in which the color filters M are formed on the first substrate 101, a ratio of ε to η is a parameter determined at the time of manufacture. For example, the ratio of ε to η is determined by transmission characteristics of the color filter M and the color filter R, or spectral sensitivity of the first substrate 101 and the second substrate 102 determined based on the thickness and the like of the first substrate 101 and the second substrate 102.

Next, a method of calculating RGB color information by the signal processor 106 will be described in detail. The signal processor 106 calculates RGB color information of each of the first pixels 1011-1 to 1011-16 using the first signal output from the first pixels 1012-1 to 1011-16 on the first substrate 101 and the second signal out from the second pixels 1021-1 to 1021-16 on the second substrate 102. The signal processor 106 calculates the RGB color information of each of the first pixels 1011-1 to 1011-16 by performing two steps of a first step and a second step described below.

(First Step)

In the first step, the signal processor 106 performs operation processing using a first signal transmitted through the complementary color filter 103 and a second signal transmitted through the primary color filter 104, and separately calculates color information of two colors among the RGB color information of each of the first pixels 1011-1 to 1011-16.

For example, the operation processing is performed using a first signal "αG+βR" output from the first pixel 1011-1 in which the color filter Y for transmitting yellow (Y) (=G+R) light is formed and a second signal "γR" output from the second pixel 1021-1 in which the color filter R for transmitting red light is formed, and the color information of "G" and the color information of "R" in the first pixel 1011-1 are calculated.

Specifically, since the values of α, β, and γ are known, and the ratio of β to γ is known, "βR" in the first signal "αG+βR" is calculated using the second signal "γR." Accordingly, it is possible to calculate the color information of pure "R." Subsequently, "αG" is calculated by subtracting the calculated "βR" from the first signal "αG+βR." Accordingly, it is possible to calculate the color information of pure "G." That is, it is possible to calculate the color information of the pure "G" and "R" in the first pixel 1011-1 in which the color filter Y is provided using the operation method described above. The same processing is performed in each of the first pixels 1011-1, 1011-3, 1011-6, 1011-8, 1011-9, 1011-11, 1011-14, and 1011-16 to calculate the color information of the pure "G" and "R."

In addition, for example, the operation processing is performed using a first signal "δB+εR" output from the first pixel 1011-2 in which the color filter M for transmitting magenta (M) (=B+R) light is formed and a second signal "ηR" output from the second pixel 1021-2 in which the color filter R for transmitting red light is formed, and the color information of "B" and the color information of "R" in the first pixel 1011-2 is calculated.

Specifically, since the values of δ, ε, and η are known and a ratio of ε to η is known, "εR" in the first signal "δB+εR" is calculated using the second signal "ηR." Accordingly it is possible to calculate the color information Of pure "R," Subsequently "δB" is calculated by subtracting the calculated "εR" from the first signal "δB+εR." Accordingly it is possible to calculate the color information of pure "B." That is, it is possible to calculate the color information of the pure "B" and the color information of the pure "R" in the first pixel 1011-2 in which the color filter M is provided using the operation method described above. The same processing is performed in the first pixels 1011-2, 1011-4, 1011-5, 1011-7, 1011-10, 1011-12, 1011-13, and 1011-15 to calculate the color information of the pure "B" and the color information of the pure "R."

Figure 4:
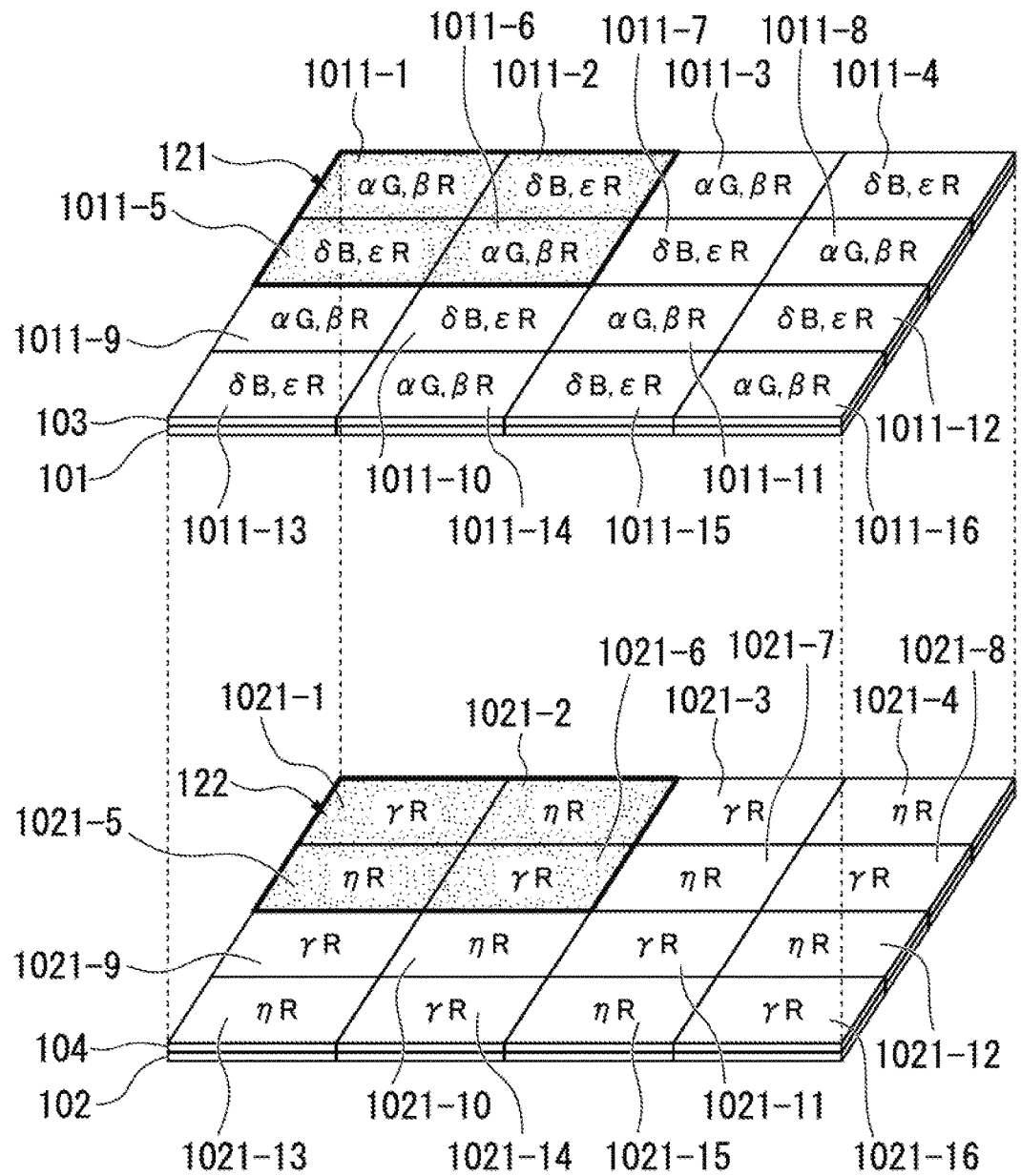
FIG. 4 is a schematic view illustrating a result of the operation of a first step according to the first embodiment of the present invention.

By performing the operation in the first step described above, it is possible to calculate the color information of two colors among the RGB color information of each of the first pixels 1011-1 to 1011-16. FIG. 4 is a schematic view illustrating a result of the operation of the first step according to the embodiment. "," in FIG. 4 shows that the color information of two colors among the RGB color information of each of the first pixels 1011-1 to 1011-16 in which the complementary color filter 103 is disposed is separately calculated.

By performing the operation of the first step, as illustrated in FIG. 4, it is possible to obtain the color information of the "αG and βR" in each of the first pixels 1011-1, 1011-3, 1011-6, 1011-8, 1011-9, 1011-11, 1011-14, and 1011-16 in which the color filters Y are formed. As described above, the color information obtained in each of the second pixels 1021-1, 1021-3, 1021-6, 1021-8, 1021-9, 1021 -11, 1021-14, and 1021-16 is "γR."

Moreover, by performing the operation of the first step, as illustrated in FIG. 4, it is possible to obtain the color information of "δB and εR" in each of the first pixels 1011-2, 1011-4, 1011-5, 1011-7, 1011-10, 1011-12, 1011-13, and 1011-15 in which the color filters M are formed. As described above, the color information obtained in each of the second pixels 1021-2, 1021-4, 1021-5, 1021-7, 1021-10, 1021-12, 1021-13, and 1021-15 is "ηR."

(Second Step)

In the second step, the color information of two colors calculated in the first step is used to calculate the color information of the remaining one color in each of the first pixels 1011-1 to 1011-16. The color information of the remaining one color is calculated by performing linear interpolation and the like using the color information of the first pixels 1011-1 to 1011-16 disposed adjacent or nearby in the same manner as demosaicing processing known in the related art.

For example, the color information of "B" is missing in the first pixel 1011-6 in which the color filter Y for transmitting yellow (Y) (=G+R) light is formed. In FIG. 4, when focusing on the first pixels 1011-1, 1011-2, 1011-3, 1011-5, 1011-7, 1011-9, 1011-10, and 1011-11 adjacent to the first pixel 1011-6, the color information of "B" is obtained in the first pixels 1011-2, 1011-5, 1011-7, and 1011-10.

The signal processor 106 performs interpolation processing using the color information of "B" in the four first pixels 1011-2, 1011-5, 1011-7, and 1011-10, and calculates the color information of "B" in the first pixel 1011-6. For example, the signal processor 106 calculates missing color information using linear interpolation and the like in the same manner as the demosaicing processing of the primary color system known in the related art. The same processing is performed in each of the first pixels 1011-1, 1011-3, 1011-8, 1011-9, 1011-11, 1011-14, and 1011-16 to calculate the color information of "B."

In addition, for example, the color information of "G" is missing in the first pixel 1011-10 in which the color filter M for transmitting magenta (M) (=B+R) light is formed. In FIG. 4, when focusing on the first pixels 1011-5, 1011-6, 1011-7, 1011-9, 1011-11, 1011-13, 1011-14, and 1011-15 adjacent to the first pixel 1011-10, the color information of "G" is obtained in the first pixels 1011-6, 1011-9, 1011-11, and 1011-14.

The signal processor 106 performs the interpolation processing using the color information of "G" in the four first pixels 1011-6, 1011-9, 1011-11, and 1011-14, and calculates the color information of "G" in the first pixel 1011-10. For example, the signal processor 106 calculates missing color information using the linear interpolation and the like in the same manner as the demosaicing processing of the primary color system known in the related art. The same processing is also performed in each of the first pixels 1011-2, 1011-4, 1011-5, 1011-7, 1011-12, 1011-13. and 1011-15 to calculate the color information of "G."

The signal processor 106 can calculate RGB color information in each of the first pixels 1011-1 to 1011-16 by performing the first step and the second step described above.

For example, in an imaging element including a color filter of the Bayer array of the primary color system which is said to have good color reproduction and is known in the related art, when focusing on a pixel which Obtains the color information of "B" at the time of performing demosaicing, four pixels Obtain the color information of "G" and four pixels obtain the color information of "R'" among eight adjacent pixels. Moreover, when focusing on a pixel obtaining the color information of "G," two pixels obtain the color information of "B" and two pixels obtain the color information of "R" among .eight adjacent pixels. Moreover, when focusing on a pixel obtaining the color information of "R," four pixels obtain the color information of "B" and four pixels obtain the color information of "G" among eight adjacent pixels.

On the other hand, in the embodiment, all of the first pixels 1011 obtain the color information of "R." in addition, at the time of performing the demosaicing processing, when focusing on the first pixel 1011 obtaining the color information of Y (=G+R), four pixels obtain the color information of "B" among eight adjacent pixels. Moreover, when focusing on the first pixel 1011 obtaining the color information of "M (=B+R)," four pixels obtain the color information of "G" among eight adjacent pixels.

As described above, in the embodiment, since adjacent pixels obtaining missing color information are increased at the time of performing the demosaicing processing color interpolation accuracy is improved. In addition, since the complementary c tor filter 103 is formed in the first pixel 1011, the sensitivity of the first pixel 1011 is a high sensitivity. Therefore, the imaging element 100 of the embodiment Can increase sensitivity and accuracy of color reproduction.

(Second Embodiment)

Next, a second embodiment of the present invention will be described. The arrangement of a complementary color filter and the arrangement of a primary color filter of the embodiment are different from in the first embodiment. The other configurations of an imaging element 200 in the embodiment are the same as the configurations of the imaging element 100 in the first embodiment.

Figure 5:
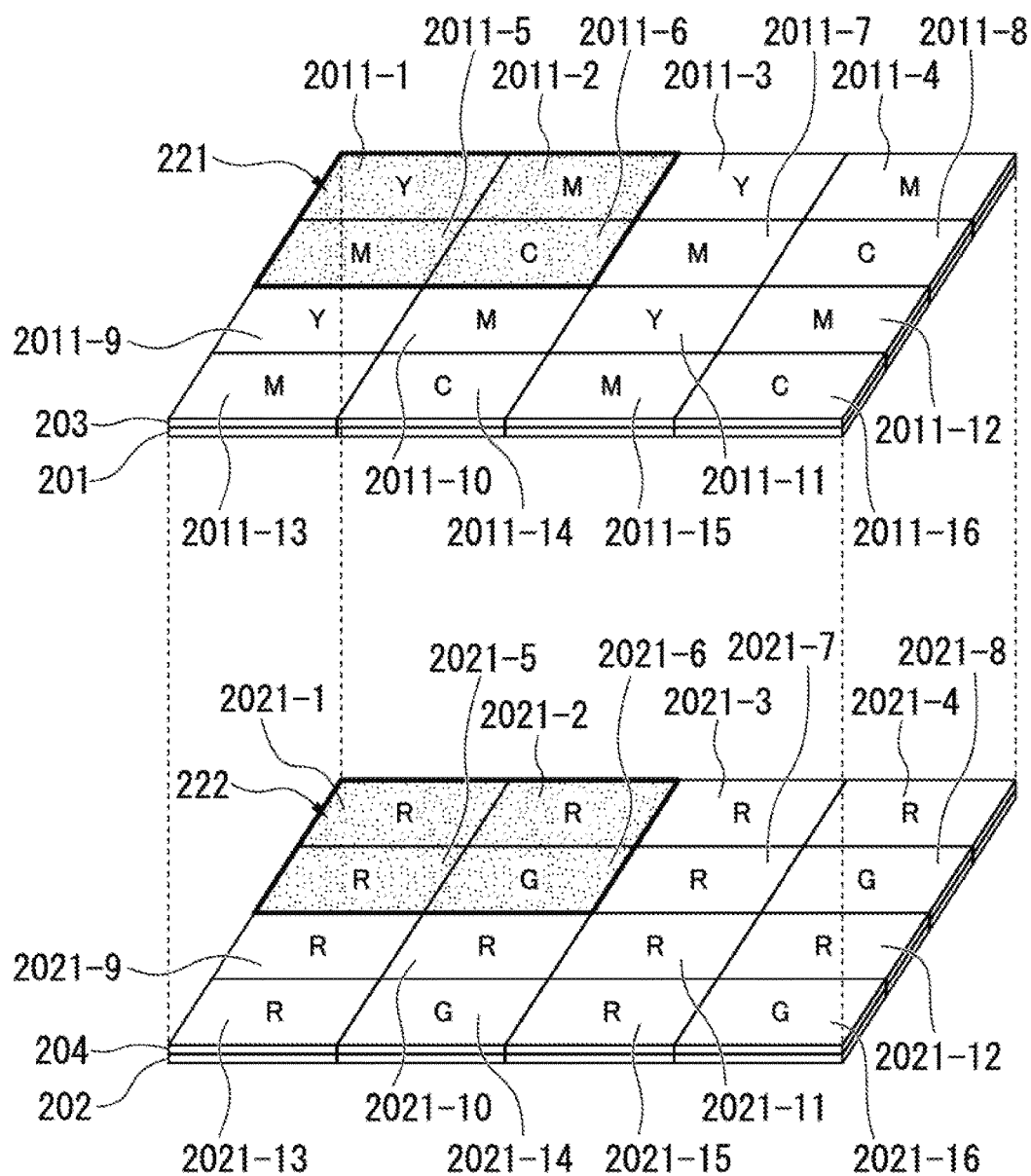
FIG. 5 is a schematic view illustrating the arrangement of a complementary color filter and the arrangement of a primary color filter according to a second embodiment of the present invention.

FIG. 5 is a schematic view illustrating the arrangement of a complementary color filter 203 and the arrangement of a primary color filter 204 according to the embodiment. In the illustrated example, a total of 16 first pixels 2011-1 to 2011-16 which are arranged in a two dimensional shape of four rows and four columns are included in a first substrate 201. In addition, a total of 16 second pixels 2021-1 to 2021-16 which are arranged in a two dimensional shape of four rows and four columns are included in a second substrate 202. The number and the arrangement of the first pixels 2011 included in the first substrate 201 and the second pixels 2021 included in the second substrate 202 are not limited to the illustrated example, but may be any number and arrangement. p The complementary color filter 203 formed on the first substrate 201 is a filter in which color filters M for transmitting magenta (M) (=B+R) light, color filters Y for transmitting yellow (Y) (=G+R) light, and color filters C for transmitting cyan (C) (=B+G) light are arranged. The color filters Y (first color filter) for transmitting yellow (Y) (first wavelength band) light are formed in the first pixels 2011-1, 2011-3, 2011-9, and 2011-11 (first light receiving element). The color filters M (first color filter) for transmitting magenta (M) (the first wavelength band) light are formed in the first pixels 2011-2, 2011-4, 2011-5, 2011-7, 2011-10, 2011-12, 2011-13, and 2011-15 (first light receiving element). The color filters C (third color filter) for transmitting cyan (C) (fourth wavelength band) light are formed in the first pixels 2011-6, 2011-8, 2011-14, and 2011-16 (third light receiving element).

In addition, four of the first pixels 2011 vertically and horizontally adjacent to each other are set to be a set of a unit pixel region 221. For example, the set of the unit pixel region 221 is configured of two first pixels 2011-2 and 2011-5 in which the color filters M for transmitting magenta light are formed, one first pixel 2011-1 in which the color filter Y for transmitting yellow light is formed, and one first pixel 2011-6 in which the color filter C for transmitting cyan light is formed.

The primary color filter 204 formed on the second substrate 202 is a filter in which color filters R for transmitting red (R) light and color filters G for transmitting green (G) light are arranged. The color filters R (second color filter) for transmitting red (R) (second wavelength band) light are formed in the second pixels 2021-1 to 2021-5, 2021-7, 2021-9 to 2021-13, and 2021-15 (second light receiving element). The color filters G (fourth color filter) for transmitting green (G) (fifth wavelength band) light are formed in the second pixels 2021-6, 2021-8, 2021-14, and 2021-16 (fourth light receiving element).

In addition, four of the second pixels 2021 vertically and horizontally adjacent to each other are set to be a set of a unit pixel region 222. For example, the set of the unit pixel region 222 is configured of three second pixels 2021-1, 2021-2, and 7021-5 in which the color filters R for transmitting red light are formed, and one second pixel 2021-6 in which the color filter G for transmitting green light is formed.

In addition, the first pixels 2011-1 to 2011-16 included in the first substrate 201 and the second pixels 2021-1 to 2021-16 included in the second substrate 202 are disposed to have a one-to-one correspondence relationship with each other. For example, the first pixel 2011-1 and the second pixel 2021-1 are disposed so that light transmitted through the first pixels 2011-1 is emitted only to the corresponding second. pixel 2021-1. In addition, the first pixel 2011-2 and the second pixel 2021-2 are disposed so that light transmitted through the first pixel 2011-2 is emitted only to the corresponding second pixel 2021-2. In the same manner, the first pixels 2011-3 to 2011-16 and the second pixels 2021-3 to 2021-16 are also disposed as illustrated.

As described above, the color filters G for transmitting green (G) light are formed in the second pixels 2021-6, 2021-8, 2021-14, and 2021-16 corresponding to the first pixels 2011-6, 2011-8, 2011-14, and 2011-16 in which the color filters C for transmitting cyan (C) light are disposed. This is because the color filter C for transmitting cyan (C) (=B+G) light does not allow the red (R) light to he transmitted and allows the blue (B) light and the green (G) light to be transmitted.

Next, the operation of the imaging element 200 will be described. In the embodiment, a case of using the imaging element 200 in a digital camera will be described. Light from which infrared light is cut by an infrared light (IR) cut filter is emitted to the imaging element 200.

Light is incident on the light receiving surface side of the first substrate 201. Each of the first pixels 2011-1 to 2011-16 detects light transmitted through the complementary color filter 203 and outputs a first signal or a third signal. Specifically, the first pixels 2011-1, 2011-3, 2011-9, and 2011-11 in which the color filters Y for transmitting yellow (Y) light are formed output a first signal corresponding to the intensity of the yellow (Y) light. In addition, the first pixels 2011-2, 2011-4, 2011-5, 2011-7, 2011-10, 2011-12, 2011-13, and 2011-15 in which the color filters M for transmitting magenta (M) light are formed output a first signal corresponding to the intensity of the magenta (M) light. Moreover, the first pixels 2011-6, 2011-8, 2011-14, and 2011-16 in which the color filters C for transmitting cyan (C) light are formed output a third signal corresponding to the intensity of the cyan (C) light.

In addition, each of the second pixels 2021-1 to 2021-16 on the second substrate 202 detects light transmitted through the complementary color filter 203, the first substrate 201, and the primary color filter 204, and outputs a second signal or a fourth signal. Specifically, the second pixels 2021-1 to 2021-5, 2021-7, 2021-9 to 2021-13, and 2021-15 in Which the color filters R for transmitting red (R) light are formed output the second signal corresponding to the intensity of the red (R) light. In addition, the second pixels 2021-6, 2021-8, 2021-14, and 2021-16 in which the color filters G for transmitting the green (G) light are formed output a fourth signal corresponding to the intensity of the green (G) light.

The first signal and the third signal output from the first pixels 2011-1 to 2011-16, and the second signal and the fourth signal output from the second pixels 2021-1 to 2021 16 are each output to the signal processor 106 through the connecting section 105. The signal processor 106 generates a full color image having the RGB color information of each of the first pixels 2011-1 to 2011-16 using the first signal to the fourth signal.

Figure 6:
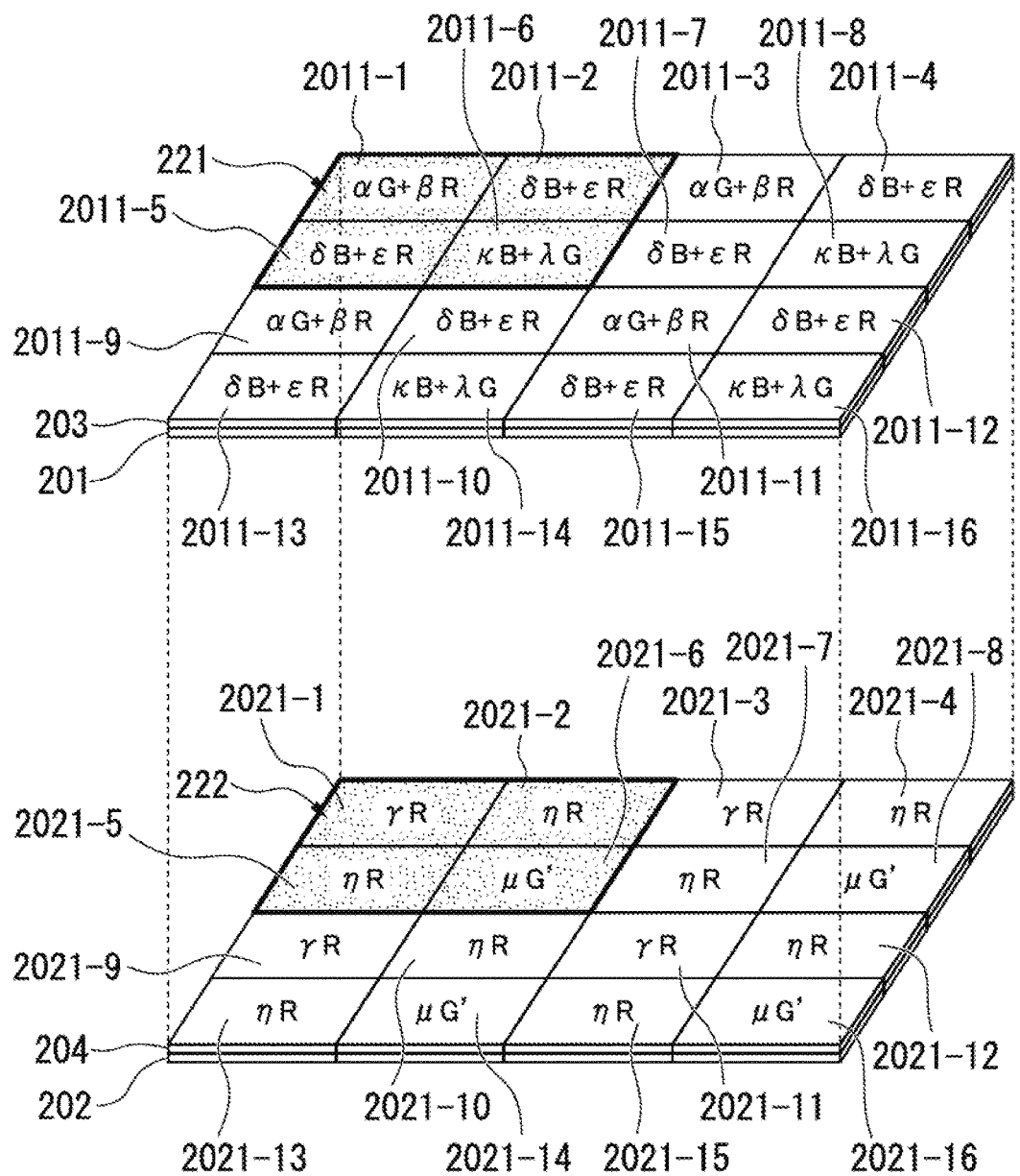
FIG. 6 is a schematic view illustrating a first signal and a third signal output from a first pixel, and a second signal and a fourth signal output from a second pixel according to the second embodiment of the present invention.

Next, the first signal and the third signal output from the first pixels 2011-1 to 2011-16 and the second signal and the fourth signal output from the second pixels 2021-1 to 2021-16 will be described. FIG. 6 is a schematic view illustrating the first signal and the third signal output from the first pixels 2011-1 to 2011-16, and the second signal and the fourth signal output from the second pixel 2021-1 to 2021-16 according to the embodiment.

As described above, the color filters Y for transmitting yellow (Y) light are formed in the first pixels 2011-1, 2011-3, 2011-9, and 2011-11. Yellow (Y) is the complementary color (=Green (G)+Red (R)) of blue (B). Here, the first signal output from the first pixels 2011-1, 2011-3, 2011-9, and 2011-11 is set to be $\alpha G+\beta R$. G is a value corresponding to the intensity of the green light. R is a value corresponding to the intensity of the red light. The values of a and are fixed values determined at the time of manufacture of the color filter Y.

Moreover, as described above, the color filters M for transmitting magenta (M) light are formed in the first pixels 2011-2, 2011-4, 2011-5, 2011-7, 2011-10, 2011-12, 2011-13, and 2011-15. Magenta (M) is the complementary color (=Blue (B)+Red (R)) of green (G). Here, the first signal output from the first pixels 2011-2, 2011-4, 2011-5, 2011-7, 2011-10, 2011-12, 2011-13, and 2011-15 is set to be $\delta B+\varepsilon R$. B is a value corresponding to the intensity of the blue light. R is a value corresponding to the intensity of the red light. The values of $\delta$ and $\varepsilon$ are fixed values determined at the time of manufacture of the color filter M.

In addition, as described above, the color filters C for transmitting cyan (C) light are formed in the first pixels 2011-6, 2011-8, 2011-14, and 2011-16. Cyan (C) is the complementary color (=Blue (B)+Green (G)) of red (R). Here, the third signal output from the first pixels 2011-6, 2011-8, 2011-14, and 2011-16 is set to be $\kappa B+\lambda G$. B is a value corresponding to the intensity of the blue light. G is a value corresponding to the intensity of the green light. The values of and $\kappa$ and $\lambda$ are fixed values determined at the time of manufacture of the color filter C.

In addition, as described above, the color filters R for transmitting red (R) light are formed in the second pixels 2021-1 to 2021-5, 2021-7, 2021-9 to 2021-13, and 2021-15. Light transmitted through the first pixels 2011-1, 2011-3, 2011-9, and 2011-11 is incident on the second pixels 2021-1, 2021-3, 2021-9, and 2021-11. That is, light transmitted through the color filter Y the first substrate 201, and the color filter R is incident on the second pixels 2021-1, 2021-3, 2021-9, and 2021-11. Here, the second signal output from the second pixels 2021-1, 2021-3, 2021-9, and 2021-11 is set to be $\gamma R$. R is a value corresponding to the intensity of the red light. The value of $\gamma$ is a fixed value determined at the time of manufacture of the color filter R.

Moreover, when focusing on the red light transmitted through the first pixels 2011-1, 20113, 2011-9, and 2011-1.1 in which the color filters Y are formed on the first substrate 201, a ratio of $\beta$ to $\gamma$ is a parameter determined at the time of manufacture. For example, the ratio of $\beta$ to $\gamma$ is determined by transmission characteristics of the color filter Y and the color filter R, or spectral sensitivity of the first substrate 201 and the second substrate 202 determined based on the thickness and the like of the first substrate 201 and the second substrate 207.

Light transmitted through the first pixels 2011-2, 2011-4, 2011-5, 2011-7, 2011-10, 2011-12, 2011-13, and 2011-15 is incident on the second pixels 2021-2, 2021-4 2021-5, 2021-7, 2021-10, 2021-12, 2021-13, and 2021-15. That is, light transmitted through the color filter M, the first substrate 201, and the color filter R is incident on the second pixels 2021-2, 2021-4, 2021-5, 2021-7, 2021-10, 2021-12, 2021-13, and 2021-15. Here, the second signal output from the second pixels 2021-2, 2021-4, 2021-5, 2021-7, 2071-10, 2021-12, 2021-13, and 2021-15 is set t be $\eta$R. R is the value corresponding to the intensity of the red light. The value of $\eta$ is a fixed value determined at the time of manufacture of the color filter R.

In addition, when focusing on the red light transmitted through the first pixels 2011-2, 2011-4, 2011-5, 2011-7, 2011-10, 2011-12, 2011-13, and 2011-15 in which the color filters M are formed on the first substrate 201, a ratio of $\epsilon$ to $\eta$ is a parameter determined at the time of manufacture. For example, the ratio of $\epsilon$ to $\eta$ is determined by transmission characteristics of the color filter M and the color filter R, or spectral sensitivity of the first substrate 201 and the second substrate 202 determined based on the thickness and the like of the first substrate 201 and the second substrate 202.

Moreover, as described above, the color filters G for transmitting green (G) light are formed in the second pixels 2021-6, 2021-8, 2021-14, and 2021-16. Light transmitted through the first pixels 2011-6, 2011-8, 2011-14, and 2011-16 is incident on the second pixels 2021-6, 2021-8, 2021-14, and 2021-16. That is, light transmitted through the color filter C, the first substrate 201, and the color filter G is incident on the second pixels 2021-6, 2021-8, 2021-14, and 2021-16.

The green light includes a wavelength of 500 nm or less. in addition, the first substrate 201 allows a portion of light with the wavelength of 500 nm or more to be transmitted. Therefore, light with the wavelength of 500 nm or less among the green light incident on the light receiving surface of the imaging element 200 does not reach the second substrate 202. That is, the second pixels 2021-6, 2021-8 2021-14, and 2021-16 detect light in a high wavelength region among the green light. Here, the fourth signal output from the second pixels 2021-6, 2021-8, 2021-14, and 2021-16 is set to be $\mu$G'. G' is a value corresponding to the intensity of the light in the high wavelength region among the green light. The value of $\mu$ is a fixed value determined at the time of manufacture of the color filter G.

Next, a method of calculating RGB color information by the signal processor 106 will be described in detail. The signal processor 106 calculates RGB color information of each of the first pixels 2011-1 to 2011-16 using the first signal and the third signal output from the first pixels 2011-1 to 2011-16 on the first substrate 201 and the second signal and the fourth signal output from the second pixels 2021-1 to 2021-16 on the second substrate 202. The signal processor 106 calculates the RGB color information of each of the first pixels 2011-1 to 2011-16 by performing two steps of a first step and a second step described below.

(First Step)

In the first step, the signal processor 106 calculates the color information of "G" and the color information of "R" in the first pixels 2011-1, 2011-3, 2011-9, and 2011-11 in which the color filters Y for transmitting yellow (Y) (=G+R) light are formed. The calculation method is the same as in the first embodiment.

In addition, the signal processor 106 calculates the color information of "B" and the color information of "R" in the first pixels 2011-2, 2011-4, 2011-5, 2011-7, 2011-10, 2011-12, 2011-13, and 2011-15 in which the color filters M for transmitting magenta (M) (=B+R) light are formed. The calculation method is the same as in the first embodiment.

The color information of "B" and the color information of "G" in the first pixels 2011-6, 2011-8, 2011-14, and 2011-16 in which the color filter C for transmitting cyan (C) (=B+G) light is formed are not calculated because corresponding second pixels 2021-6, 2021-8, 2021-14, and 2021-16 do not hold the color information of "B" and the color information of "G." That is, since it is not possible to calculate $\lambda$G from $\mu$G' detected by the second pixels 2021-6, 2021-8, 2021-14, and 2021-16, the color information of "B" and the color information of "G" are not calculated in the first pixels 2011-6, 2011-8, 2011-14, and 2011-16 in which the color filters C are formed.

Figure 7:
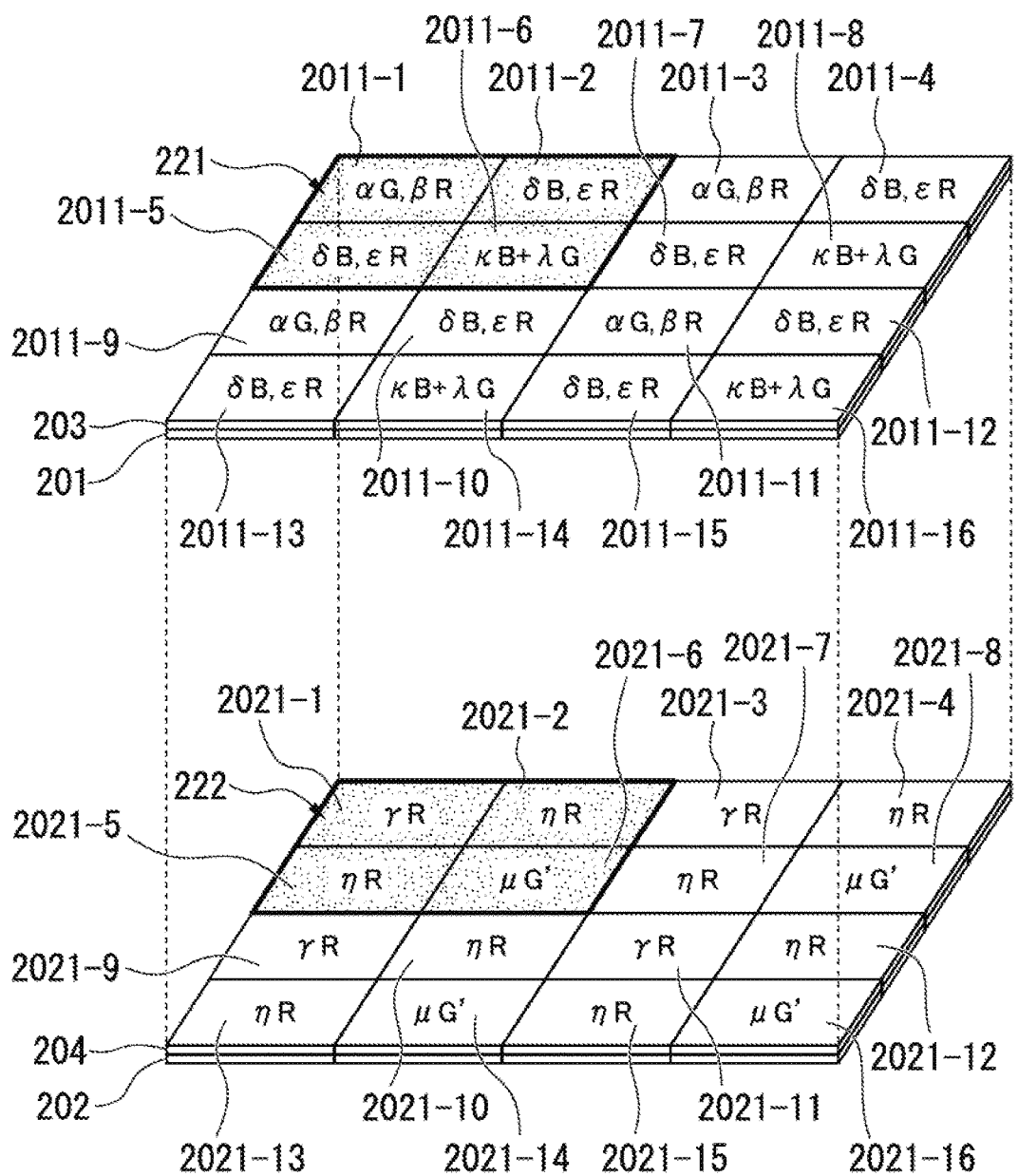
FIG. 7 is a schematic view illustrating a result of the operation of a first step according to the second embodiment of the present invention.

By performing the operation of the first step described above, it is possible to calculate the color information of two colors among the RGB color information of each of the first pixels 2011-1 to 2011-5, 2011-7, 2011-9 to 2011-13, and 2011-15. FIG. 7, is a schematic view illustrating a result of the operation of the first step according to the embodiment. "," in FIG. 7 shows that the color information of two colors among the RGB color information of each of the first pixels 2011-1 to 2011-5, 2011-7, 2011-9 to 2011-13, and 2011-15 is separately calculated.

By performing the operation of the first step, as illustrated in FIG. 7, it is possible to obtain the color information of the "$\alpha$G and 62 R" in each of the first pixels 2011-1, 2011-3, 2011-9, and 2011-11 in which the color filters Y are formed. As described above, the color information obtained in each of the second pixels 2021-1, 2021-3. 2021-9, and 2021-11 is "$\gamma$R."

In addition, by performing the operation of the first step, as illustrated, it is possible to obtain the color information of "$\delta$B and $\epsilon$R" in each of the first pixels 2011-2, 2011-4, 2011-5, 2011-7, 2011-10, 2011-12, 2011-13, and 2011-15 in which the color filters M are formed. As described above, the color information obtained in each of the second pixels 2021-2, 2021-4, 2021-5, 2021-7, 2021-10, 2021-12, 2021-13, and 2021-15 is "$\eta$R."

Moreover, since the color information of "B" and the color information of "G" are not calculated in the first pixels 2011-6, 2011-8, 2011-14, and 2011-16 in which the color filters C are formed, the first signal output from the first pixels 2011-6, 2011-8, 2011-14, and 2011-16 remains "$\kappa$B+$\lambda$G". As described above, the color information obtained in each of the second pixels 2021-6, 2021-8, 2021-14, and 2021-16 is "$\mu$G'."

(Second Step)

In the second step, missing color information in each of the first pixels 2011-1 to 2011-16 is calculated. The missing color information is calculated by performing linear interpolation and the like using the color information of the first pixels 2011-1 to 2011-16 disposed adjacent or nearby in the same manner as demosaicing processing known in the related art.

For example, the color information of "B" is missing in the first pixel 2011-11 in which the color filter Y for transmitting yellow (Y) (=G+R) light is formed. In FIG. 7, when focusing on the first pixels 2011-6, 2011-7, 2011-8, 2011-10, 2011-12, 2011-14, 2011-15, and 2011-16 adjacent to the first pixel 2011-11, the color information of "B" is obtained in the first pixels 2011-7, 2011-10, 2011-12, and 2011-15.

The signal processor 106 performs interpolation processing using the color information of "B" in the four first pixels 2011-7, 2011-10, 2011-12, and 2011-15, and calculates the color information of "B" in the first pixel 2011-11. For example, the signal processor 106 calculates missing color information using the linear interpolation and the like in the same manner as the demosaicing processing of the primary color system known in the related art. The same processing is performed in each of the first pixels 2011-1, 2011-3 and 2011-9 to calculate the color information of "B."

In addition, for example, the color information of "G" is missing in the first pixel 2011-10 in which the color filter M for transmitting magenta (M) (=B+R) light is formed. In FIG. 7, when focusing on the first pixels 2011-5, 2011-6, 2011-7, 2011-9, 2011-11, 2011-13, 2011-14, and 2011-15 adjacent to the first pixel 2011-10, the color information of "G" is obtained in the first pixels 2011-9 and 2011-11.

The signal processor 106 performs the interpolation processing using the color information of "G" in the two first pixels 2011-9 and 2011-11 and calculates the color information of "G" in the first pixel 2011-10. For example, the signal processor 106 calculates missing color information using the linear interpolation and the like in the same mariner as the demosaicing processing of the primary color system known in the related art. The same processing is also performed in each of the first pixels 2011-2, 2011-4, 2011-5, 2011-7, 2011-12, 2011-13, and 2011-15 to calculate the color information of "G."

In addition, for example, the color information of "R," the color information of "G," and the color information of "B" are missing in the first pixel 2011-6 in which the color filter C for transmitting cyan (C) (=B+G) light is formed, In FIG. 7, the first pixels 2011-1, 2011-2, 2011-3, 2011-5, 2011-7, 2011-9, 2011-10, and 2011-11 adjacent to the first pixel 2011- are focused on. In this case, the color information of "R" is obtained in the first pixels 2011-1, 2011-2, 2011-3, 2011-5, 2011-7, 2011-9, 2011-10, and 2011-11. The color information of "G" is obtained in the first pixels 2011-1, 2011-3, 2011-9, and 2011-11. The color information of "B" is obtained in the first pixels 2011-2, 2011-5, 2011-7, and 2011-10.

The signal processor 106 performs the interpolation processing using the color information of "R" in the eight first pixels 2011-1, 2011-2, 2011-3, 2011-5, 2011-7, 2011-9, 2011-10, and 2011-11, and calculates the color information of "R" in the first pixel 2011-6. In addition, the signal processor 106 performs the interpolation processing using the color information of "G" in the four first pixels 2011-1, 2011-3, 2011-9, and 2011-11, and calculates the color information of "G" in the first pixel 2011-6. Moreover, the signal processor 106 performs the interpolation processing using the color information of "B" in the four first pixels 2011-2, 2011-5, 2011-7, and 2011-10, and calculates the color information of "B" in the first pixel 2011-6.

For example, the signal processor 106 calculates missing color information using the linear interpolation and the like in the same manner as the demosaicing processing of the primary color system known in the related art. The same processing is also performed in each of the first pixels 2011-8, 2011-14, and 2011-16 to calculate the color information of "R", the color information of "G", and the color information of "B."

By performing the first step and the second step described above, the signal processor 106 can calculate the RGB color information of each of the first pixels 2011-1 to 2011-16. Furthermore, the second pixels 2021-6, 2021-8, 2021-14, and 2021-16 corresponding to the first pixels 2011-6, 2011-8, 2011-14, and 2011-16 in which the color filters C are formed detect the color information of "G'" in a high wavelength hand of the green (G) light. There is one second pixel 2021 detecting the color information of the "G'" for every four pixels.

In this manner, in the embodiment, since adjacent pixels obtaining missing color information are increased at the time of performing the demosaicing processing, color interpolation accuracy is improved. Furthermore, by adding the color information of "G'" in a high wavelength band of the green (G) light detected by the second pixel 2021 to RGB demosaicing processing described above, it is possible to improve color interpolation accuracy at the time of performing the demosaicing processing and to further increase RGB color reproduction. In addition, since the complementary color filter 203 is formed in the first pixel 2011, the sensitivity of the first pixel 2011 is a high sensitivity. Therefore, the imaging element 200 of the embodiment can increase sensitivity and accuracy of color reproduction.

(Third Embodiment)

Next, a third embodiment of the present invention will be described. The arrangement of a complementary color filter and the arrangement of a primary color filter in the embodiment are different from in the first embodiment.

The other configurations of an imaging element 300 in the embodiment are the same the configurations of the imaging element 100 in the first embodiment.

Figure 8:
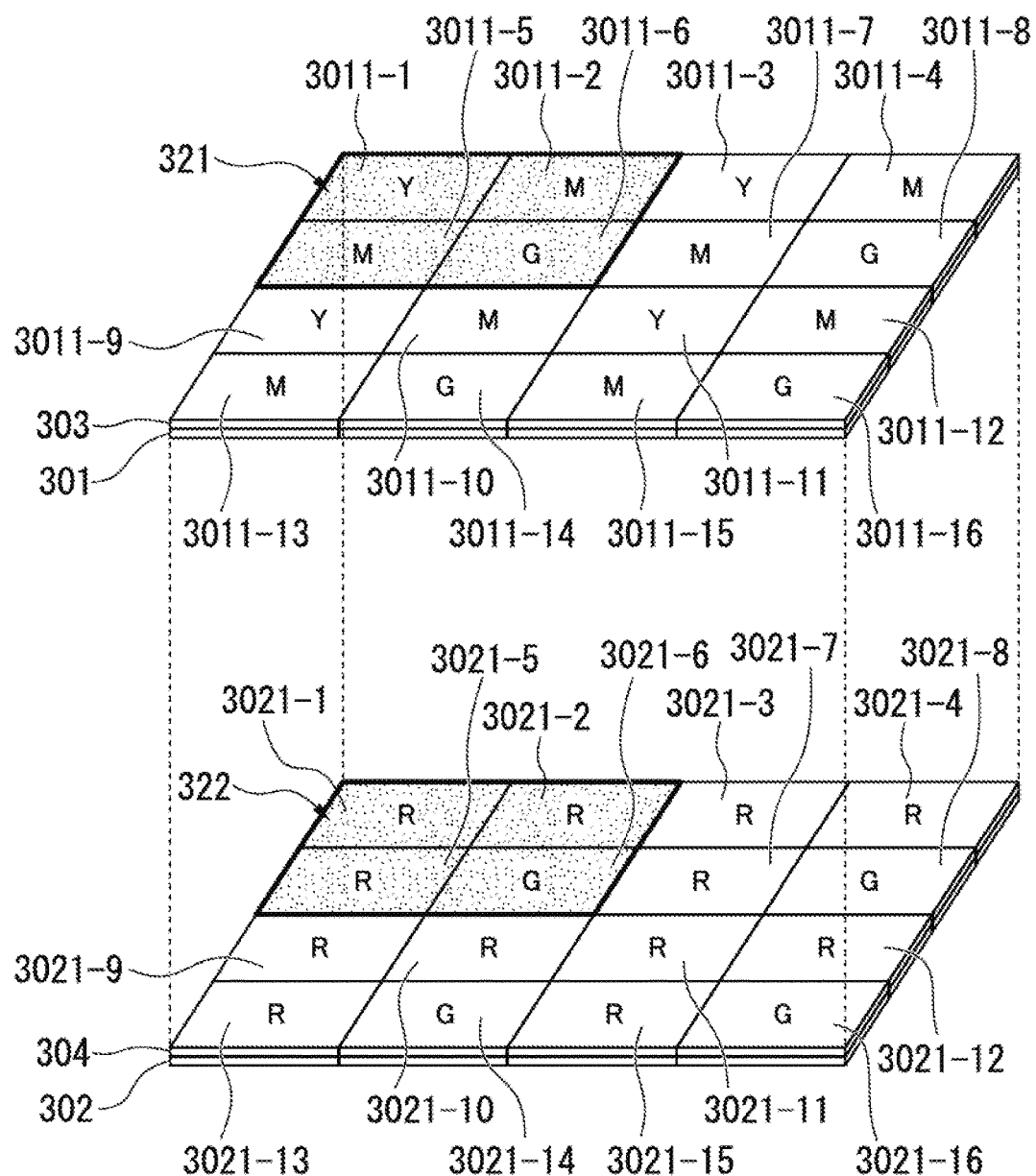
FIG. 8 is a schematic view illustrating the arrangement of a complementary color filter and the arrangement of a primary color filter according to a third embodiment of the present invention.

FIG. 8 is a schematic view illustrating the arrangement of a complementary color filter 303 and the arrangement of a primary color filter 304 according to the embodiment. As illustrated in FIG. 8. a total of 16 first pixels 3011-1 to 3011-16 which are arranged in a two dimensional shape of four rows and four columns are included in a first substrate 301, In addition, a total of 16 second pixels 3021-1 to 3021-16 which are arranged in a two dimensional shape of four rows and four columns are included in a second substrate 302. The number and the arrangement of the first pixels 3011 included in the first substrate 301 and the second pixels 3021 included in the second substrate 302 are not limited to the illustrated example, but may be any number and arrangement.

The complementary color filter 303 formed on the first substrate 301 is a filter in which color filters M for transmitting magenta (M) (=B+R) light, color filters Y for transmitting yellow (Y) (=G+R) light, and color filters G for transmitting green (G) light are arranged. The color filters Y (first color filter) for transmitting yellow (Y) (first wavelength band) light are formed in the first pixels 3011-1, 3011-3, 3011-9, and 3011-11 (first light receiving element). The color filters M (first color filter) for transmitting magenta (M) (the first wavelength band) light are formed in the first pixels 3011-2, 3011-4, 3011-5, 3011-7, 3011-10, 3011-12, 3011-13, and 3011-15 (first light receiving element). The color filters G (third color filter) for transmitting green (G) (fourth wavelength band) light are formed in the first pixels 3011-6, 3011-8, 3011-14, and 3011-16 (third light receiving element).

In addition, four of the first pixels 3011 vertically and horizontally adjacent to each other are set to be a set of a unit pixel region 321. For example, the set of the unit pixel region 321 is configured of two first pixels 3011-2 and 3011-5 in which the color filters M for transmitting magenta light are formed, one first pixel 3011-1 in which the color filter Y for transmitting yellow light is formed, and one first pixel 3011-6 in which the color filter G for transmitting green light is formed.

The primary color filter 304 formed on the second substrate 302 is a filter in which color filters R for transmitting red (R) light and the color filters G for transmitting green (G) light are arranged. The color filters R (second color filter) for transmitting red (R) light are formed in the second pixels 3021-1 to 3021-5, 3021-7, 3021-9 to 3021-13, and 3021-15 (second light, receiving element). The color filters G (fourth color filter) for transmitting green (G) (fifth wavelength band) light are formed in the second pixels 3021-6, 3021-8, 3021-14, and 3021-16 (fourth light receiving element).

In addition, four of the second pixels 3021 vertically and horizontally adjacent to each other are set to be a set of a unit pixel region 322. For example, the set of the unit pixel region 322 is configured of three second pixels 3021-1, 3021-2, and 3021-5 in which the color filters R for transmitting red light are formed, and one second pixel 3021-6 in which the color filter G for transmitting green light is formed.

In addition, the first pixels 3011-1 to 3011-16 included in the first substrate 301 and the second pixels 3021-1 to 3021-16 included in the second substrate 302 are disposed to have a one-to-one correspondence relationship with each other. For example, the first pixel 3011-1 and the second pixel 3021-1 are disposed so that light transmitted through the first pixel 3011-1 is emitted only to the corresponding second pixel 3021-1. In addition, the first pixel 3011-2 and the second pixel 3021-2 are disposed so that light transmitted through the first pixel 3011-2 is emitted only to the corresponding second pixel 3021-2. In the same manner, the first pixels 3011-3 to 3011-16 and the second pixels 3021-3 to 3021-16 are also disposed as illustrated.

As described above, the color filters G for transmitting green (G) light are formed in the second pixels 3021-6, 3021-8, 3021-14, and 3021-16 corresponding to the first pixels 3011-6, 3011-8, 3011-14, and 3011-16 in which the color filters G for transmitting green (G) light are disposed. This is because the color filter G for transmitting green (G) light does not allow the red (R) light to he transmitted but allows the green (G) light to be transmitted.

Next, the operation of the imaging element 300 will be described. In the embodiment, a case of using the imaging element 300 in a digital camera will be described. Light from which infrared light is cut by an infrared light (IR) cut filter is emitted to the imaging element 300.

Light is incident on the light receiving surface side of the first substrate 301. Each of the first pixels 3011-1 to 3011-16 detects light transmitted through the complementary color filter 303 and outputs a first signal. Specifically, the first pixels 3011-1, 3011-3, 3011-9, and 3011-11 in which the color filters Y for transmitting yellow (Y) light are formed output a first signal corresponding to the intensity of the yellow (Y) light. In addition, the first pixels 3011-2, 3011-4, 3011-5, 3011-7, 3011-10, 3011-12, 3011-13, and 3011-15 in Which the color filters M for transmitting magenta (M) light are formed output a first signal corresponding to the intensity of the magenta (M) Moreover, the first pixels 3011-6, 3011-8, 3011-14, and 3011-16 in which the color filters G for transmitting the green (G) light are formed output a third signal corresponding to the intensity of the green (G) light.

In addition, each of the second pixels 3021-1 to 3021-16 on the second substrate 302 detects light transmitted through the complementary color filter 303, the first substrate 301, and the primary color filter 304, and outputs a second signal. Specifically;

the second pixels 3021-1 to 3021-5, 3021-7, 3021-9 to 3021-13, and 3021-15 in which the color filters R for transmitting red (R) light are thrilled output a second signal corresponding to the intensity of the red (R) light. In addition, the second pixels 3021-6, 3021-8, 3021-14, and 3021-16 in which the color filters G for transmitting the green (G) light are formed output a fourth signal corresponding to the intensity of the green (G) light.

The first signal and the third signal output from the first pixels 3011-1 to 3011-16, and the second signal and the fourth signal output from the second pixels 3021-1 to 021-16 are each output to the signal processor 106 through the connecting section 105. The signal processor 106 generates a full color image having the RGB color information of each of the first pixels 3011-1 to 3011-16 using the first signal to the fourth signal.

Figure 9:
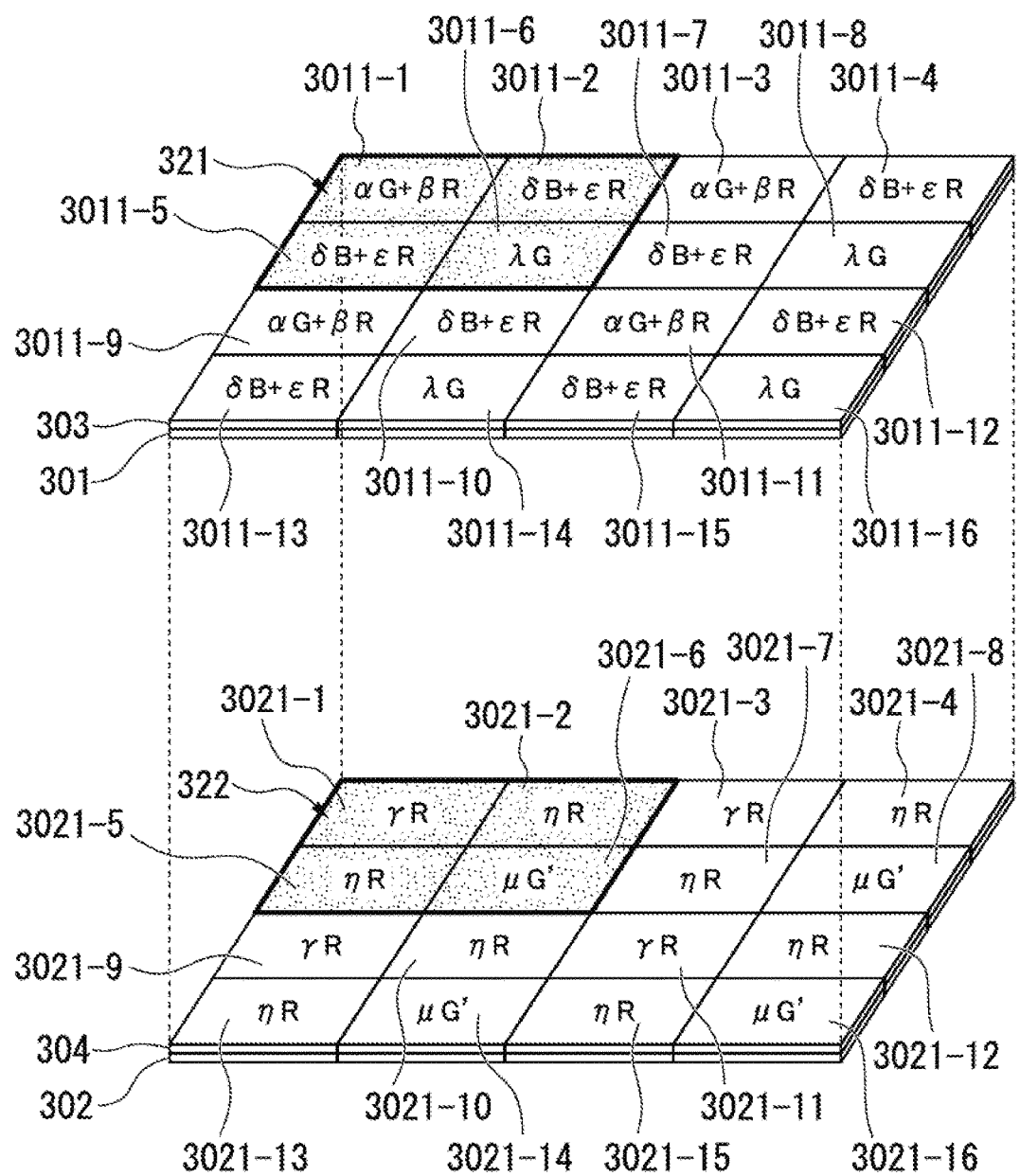
FIG. 9 is a schematic view illustrating a first signal output from a first pixel and a second signal output from a second pixel according to the third embodiment of the present invention.

Next, the first signal and the third signal output from the first pixels 3011-1 to 3011-16 and the second signal and the fourth signal output from the second pixels 3021-1 to 3021-16 will be described. FIG. 9 is a schematic view illustrating the first signal and the third signal output from the first pixels 3011-1 to 3011-16 and the second signal and the fourth signal output from the second pixels 3021-1 to 3021-16 according to the embodiment.

As described above, the color filters Y for transmitting yellow (Y) light are formed in the first pixels 3011-1, 3011-3, 3011-9, and 3011-11. Yellow (Y) is the complementary color (=Green (G)+Red (R)) of blue (B). Here, the first signal output from the first pixels 3011-1, 3011-3, 3011-9, and 3011-11 is set to be $\alpha G+\beta R$. G is a value corresponding to the intensity of the green light. R is a value corresponding to the intensity of the red light. The values of $\alpha$ and $\beta$ are fixed values determined at the time of manufacture of the color filter Y.

Moreover, as described above, the color filters M for transmitting magenta (M) light are formed in the first pixels 3011-2, 3011-4, 3011-5, 3011-7, 3011-10, 3011-12, 3011-13, and 3011-15. Magenta (M) is the complementary color (=Blue (B)+Red (R)) of green (G). Here, the first signal output from the first pixels 3011-2, 3011-4, 3011-5, 3011-7, 3011-10, 3011-12, 3011-13, and 3011-15 is set to be $\delta B+\epsilon R$. B is a value corresponding to the intensity of the blue light. R is a value corresponding to the intensity of the red light. The values of $\delta$ and $\epsilon$ are fixed values determined at the time of manufacture of the color filter M.

In addition, as described above, the color filters G for transmitting green (G) light are formed in the first pixels 3011-6, 3011-8, 3011-14, and 3011-16. Here, the third signal output from the first pixels 3011-6, 3011-8, 3011-14, and 3011-16 is set to be $\lambda G$. G is a value corresponding to the intensity of the green light. The value of $\lambda$ is a fixed value determined at the time of manufacture of the color filter G of the complementary color filter 303.

In addition, as described above, the color filters R for transmitting red (R) light are formed in the second pixels 3021-1 to 3021-5, 3021-7, 3021-9 to 3021-13, and 3021-15. Light transmitted through the first pixels 3011-1, 3011-3, 3011-9, and 3011-11 is incident on the second pixels 3021-1, 3021-3, 3021-9, and 3021-11. That is, light transmitted through the color filter Y, the first substrate 301, and the color filter R is incident on the second pixels 3021-1, 3021-3, 3021-9, and 3021-11. Here, the second signal output from the second pixels 3021-1, 3021-3, 3021-9, and 3021-11 is set to be $\gamma R$. R is a value corresponding to the intensity of the red light. The value of $\gamma$ is a fixed value determined at the time of manufacture of the color filter R.

Moreover, when focusing on the red light transmitted through the first pixels 3011-1, 3011-3, 3011-9 and 3011-11 in which the color filters Y are formed on the first substrate 301, a ratio of $\beta$ to $\gamma$ is a parameter determined at the time of manufacture. For example, the ratio of $\beta$ to $\gamma$ is determined by transmission characteristics of the color filter Y and the color filter R, or spectral sensitivity of the first substrate 301 and the second substrate 302 determined based on the thickness and the like of the first substrate 301 and the second substrate 302.

Light transmitted through the first pixels 3011-2, 3011-4, 3011-5, 3011-7, 3011-10, 3011-12, 3011-13, and 3011-15 is incident on the second pixels 3021-2, 3021-4, 3021-5, 3021-7, 3021-10, 3021-12, 3021-13, and 3021-15. That is, light transmitted through the color filter M, the first substrate 301, and the color filter R is incident on the second pixels 3021-2, 3021-4, 3021-5, 3021-7, 3021-10, 3021-12, 3021-13, and 3021-15. Her, the second signal output from the second pixels 3021-2, 3021-4, 3021-5, 3021-7, 3021-10, 3021-12, 3021-13, and 3021-15 is set to be $\eta R$. R is the value corresponding to the intensity of the red light. The value of $\eta$ is a fixed value determined at the time of manufacture of the color filter R.

In addition, when focusing on the red light transmitted through the first pixels 3011-2, 3011-4, 3011-5, 3011-7, 3011-10, 3011-12, 3011-13, and 3011-15 in which the color filters M are formed on the first substrate 301, a ratio of $\varepsilon$ to $\eta$ is a parameter determined at the time of manufacture. For example, the ratio of $\varepsilon$ to $\eta$ is determined by transmission characteristics of the color filter M and the color filter R, or spectral sensitivity of the first substrate 301 and the second substrate 302 determined based on the thickness and the like of the first substrate 301 and the second substrate 302.

Moreover, as described above, the color filters G for transmitting green (G) light are formed in the second pixels 3021-6, 3021-8, 3021-14, and 3021-16. Light transmitted through the first pixels 3011-6, 3011-8, 3011-14, and 3011-16 is incident on the second pixels 3021-6, 3021-8, 3021-14, and 3021-16. That is, light transmitted through the color filter G of the complementary color filter 303, the first substrate 301, and the color filter G of the primary color filter 304 is incident on the second pixels 3021-6, 3021-8, 3021-14, and 3021-16.

The green light includes a wavelength of 500 nm or less. In addition, the first substrate 301 allows a portion of light with the wavelength of 500 nm or more to be transmitted. Therefore, light with the wavelength of 500 nm or less among the green light incident on the light receiving surface of the imaging element 300 does not reach the second substrate 302. That is, the second pixels 3021-6, 3021-8, 3021-14, and 3021-16 detect light in a high wavelength region among the green light. Here, the fourth signal output from the second pixels 3021-6, 3021-8, 3021-14, and 3021-16 is set to be $\mu G'$. G' is a value corresponding to the intensity of the light in the high wavelength region among the green light. The value of $\mu$ is a fixed value determined at the time of manufacture of the color filter G of the primary color filter 304.

Next, a method of calculating RGB color information by the signal processor 106 will be described in detail. The signal processor 106 calculates RGB color information of each of the first pixels 3011-1 to 3011-16 using the first signal and the third signal output from the first pixels 3011-1 to 3011-16 on the first substrate 301 and the second signal and the fourth signal output from the second pixels 3021-1 to 3021-16 on the second substrate 302. The signal processor 106 calculates the RGB color information of each of the first pixels 3011-1 to 3011-16 by performing two steps of a first step and a second step described below.

(First Step)

In the first step, the signal processor 106 calculates the color information of "G" and the color information of "R" in the first pixels 3011-1, 3011-3, 3011-9, and 3011-11 in which the color filters Y for transmitting yellow (Y) (=G+R) light are formed. The calculation method is the same as in the first embodiment.

In addition, the signal processor 106 calculates the color information of "B" and the color information of "R" in the first pixels 3011-2, 3011-4, 3011-5, 3011-7, 3011-10, 3011-12, 3011-13, and 3011-15 in which the color filters M for transmitting magenta (M) (=B+R) light are formed. The calculation method is the same as in the first embodiment.

A first signal "$\lambda G$" is the color information of "G" in the first pixels 3011-6, 3011-8, 3011-14, and 3011-16 in which the color filters G for transmitting green light are formed.

Figure 10:
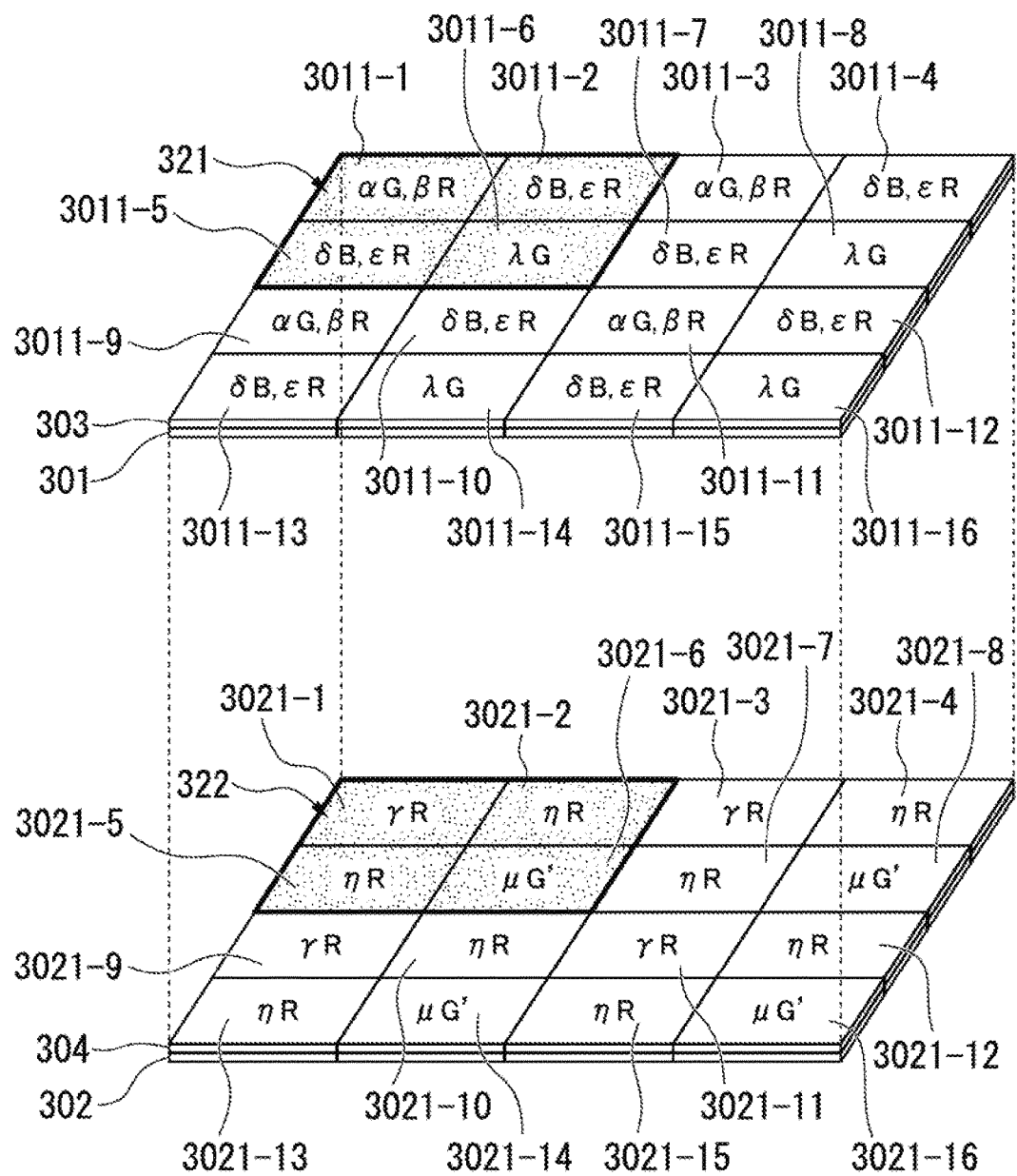
FIG. 10 is a schematic view illustrating a result of the operation of a first step according to the third embodiment of the present invention.

By performing the operation of the first step described above, it is possible to calculate the color information of two colors among the RGB color information of each of the first pixels 3011-1 to 3011-5, 3011-7, 3011-9 to 3011-13, and 3011-15. FIG. 10 is a schematic vim illustrating a result of the operation of the first step according to the embodiment. "," in FIG. 10 shows that the color information of two colors among the RGB color information of each of the first pixels 3011-1 to 3011-5, 3011-7, 3011-9 to 3011-13, and 3011-15 is separately calculated.

By performing the operation of the first step, as illustrated in FIG. 10, it is possible to obtain the color information of the "$\alpha G$ and $\beta R$" in each of the first pixels 3011-1, 3011-3, 3011-9, and 3011-11 in which the color filters Y are formed. As described above, the color information obtained in each of the second pixels 3021-1, 3021-3, 3021-9, and 3021-11 is "$\gamma R$."

In addition, by performing the operation of the first step, as illustrated in FIG. 10 it is possible to obtain the color information of "$\delta B$ and $\varepsilon R$" in each of the first pixels 3011-2, 3011-4, 3011-5, 3011-7, 3011-10, 3011-12, 3011-13, and 3011-15 in which the color filters M are formed. As described above, the color information obtained in each of the second pixels 3021-2, 3021-4, 3021-5, 3021-7, 3021-10, 3021-12, 3021-13, and 3021-15 is "$\eta R$."

Moreover, the first signal "$\lambda G$" is the color information of "G" in the first pixels 3011-6, 3011-8, 3011-14, and 3011-16 in which the color filters G are formed. As described above, the color information obtained in each of the second pixels 3021-6, 3021-8, 3021-14, and 3021-16 is "$\mu G'$."

(Second Step)

In the second step, the color information of the one or two remaining colors will be described using the color information of one or two colors in each of the first pixels 3011-1 to 3011-16. The color information of the one or two remaining colors is calculated by performing linear interpolation and the like using the color information of the first pixels 3011-1 to 3011-16 disposed adjacent or nearby in the same manner as demosaicing processing known in the related art.

For example, the color information of "B" is missing in the first pixel 3011-11 in which the color filter Y for transmitting yellow (Y) (=G+R) light is formed. In FIG. 10, when focusing on the first pixels 3011-6, 3011-7, 3011-8, 3011-10, 301 -12, 3011-14, 3011-15, and 3011-16 adjacent to the first pixel 3011-11, the color information of "B" is obtained in the first pixels 3011-7, 3011-10, 3011-12, and 3011-15.

The signal processor 106 performs interpolation processing using the color information of "B" in the four first pixels 3011-7, 3011-10, 3011-12, and 3011-15, and calculates the color information of "B" in the first pixel 3011-11. For example, the signal processor 106 calculates missing color information using, the linear interpolation and the like in the same manner as the demosaicing. processing of the primary color system known in the related art. The same processing is performed in each of the first pixels 3011-1, 3011-3, and 3011-9 to calculate the color information of "B."

In addition, for example, the color information of "G" is missing in the first pixel 3011-10 in which the color filter M for transmitting magenta (M) (=B+R) light is formed. In FIG. 10, when focusing on the first pixels 3011-5, 3011-6, 3011-7, 3011-9, 3011-11, 3011-13, 3011-14, and 3011-15 adjacent to the first pixel 3011-10, the color information of "G" is obtained in the first pixels 3011-6, 3011-9, 3011-11, and 3011-14.

The signal processor 106 performs the interpolation processing using the color information of "G" in the four first pixels 3011-6, 3011-9, 3011-11, and 3011-14 and calculates the color information of "G" in the first pixel 3011-10. For example, the signal processor 106 calculates missing color information using the linear interpolation and the like in the same manner as the demosaicing processing of the primary color system known in the related art.

The same processing is also performed in each of the first pixels 3011-2, 3011-4, 3011-5, 3011-7, 3011-12, 3011-13, and 3011-15 to calculate the color information of "G."

In addition, for example, the color information of "R" and the color information of "B" are missing in the first pixel 3011-6 in which the color filter G for transmitting green light is formed. In FIG. 10, the first pixels 3011-1, 3011-2, 3011-3, 3011-5, 3011-7, 3011-9, 3011-10, and 3011-11 adjacent to the first pixel 3011-6 are focused on. In this case, the color information of "R" is obtained in the first pixels 3011-1, 3011-2, 3011-3, 3011-5, 3011-7, 3011-9, 3011-10, and 3011-11. The color information of "B" is obtained in the first pixels 3011-2, 3011-5, 3011-7, and 3011-10.

The signal processor 106 performs the interpolation processing using the color information of "R" in the eight first pixels 3011-1, 3011-2, 3011-3, 3011-5, 3011-7, 3011-9, 3011-10, and 3011-11, and calculates the color information of "R" in the first pixel 3011-6. In addition, the signal processor 106 performs the interpolation processing using the color information of "B" in the four first pixels 3011-2, 3011-5, 3011-7, and 3011-10, and calculates the color information of "B" in the first pixel 3011-6.

For example, the signal processor 106 calculates missing color information using the linear interpolation and the like in the same manner as the demosaicing, processing of the primary color system known in the related art. The same processing is also performed in each of the first pixels 3011-8, 3011-14, and 3011-16 to calculate the color information of "R" and the color information of "B."

By performing the first step and the second step described above, the signal processor 106 can calculate the RGB color information of each of the first pixels 3011-1 to 3011-16. Furthermore, the second pixels 3021-6, 3021-8, 3021-14, and 3021-16 corresponding to the first pixels 3011-6, 3011-8, 3011-14, and 3011-16 in which the color filters G are formed detect the color information of "G'"in a high wavelength band of the green (G) light. There is one second pixel 3021 detecting the color information of the "G'" for every four pixels.

In this manner, in the embodiment, since adjacent pixels obtaining missing color information are increased at the time of performing the demosaicing processing, color interpolation accuracy is improved. Furthermore, by adding the color information of "G'" in a high wavelength band of the green (G) light detected by the second pixel 3021 to RGB demosaicing processing described above, it is possible to improve color interpolation accuracy at the time f performing the demosaicing processing and to further increase RGB color reproduction. In addition, since the complementary color filter 303 is formed in the first pixel 3011, the sensitivity of the first pixel 3011 is a high sensitivity. Therefore, the imaging element 300 of the embodiment can increase sensitivity and accuracy of color reproduction.

(Fourth Embodiment)

Next, a fourth embodiment of the present invention will be described. The embodiment is different from the first embodiment in that the light receiving area of the second pixel on the second substrate of the embodiment is wider than the light receiving area of the first pixel on the first substrate. The other configurations of an imaging element 400 in the embodiment are the same as the configurations of the imaging element 100 in the first embodiment.

Figure 11:
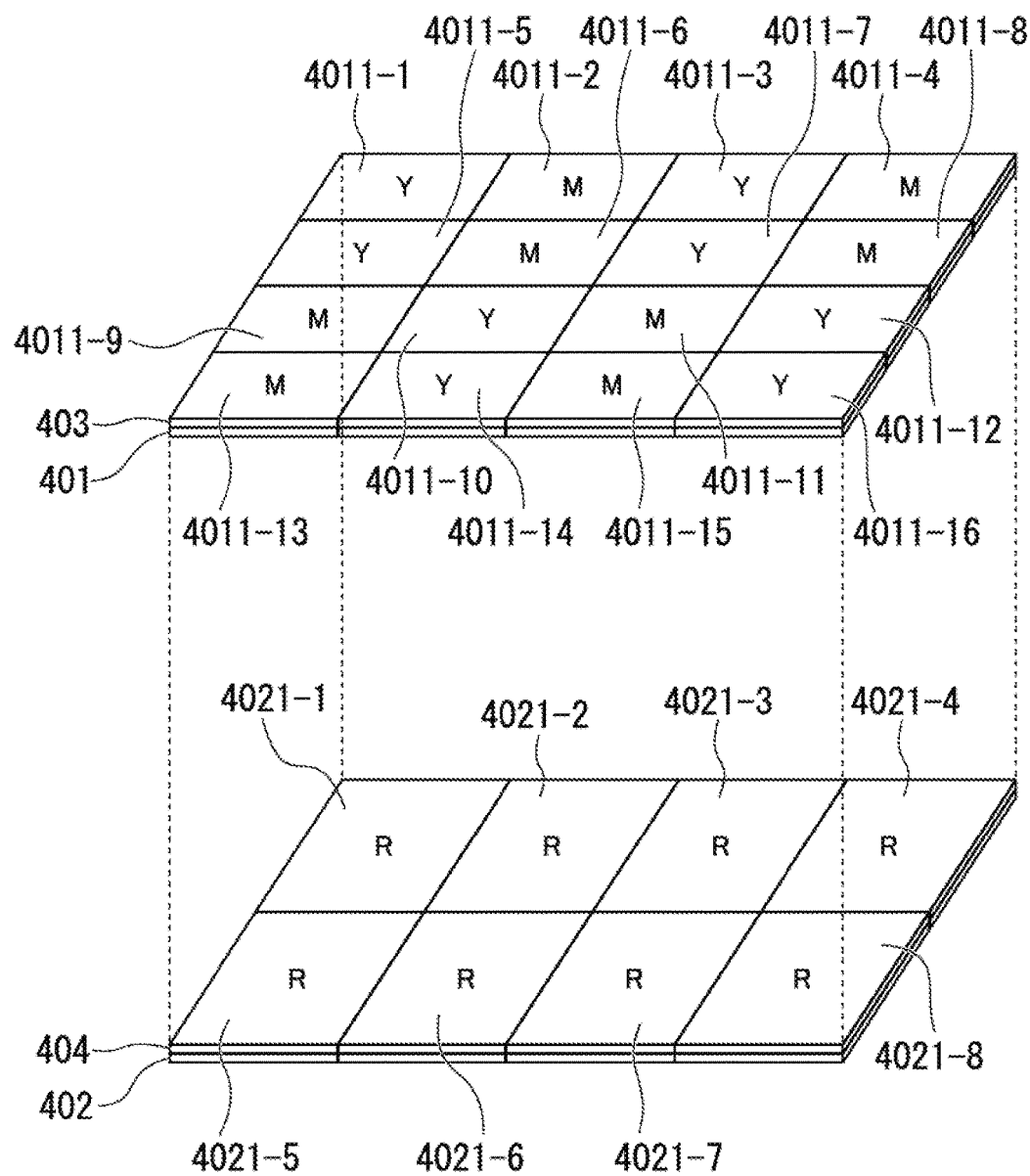
FIG. 11 is a schematic view illustrating the arrangement of a complementary color filter and the arrangement of a primary color filter according to a fourth embodiment of the pr sent invention.

FIG. 11 is a schematic view illustrating the arrangement of a complementary color filter 403 and the arrangement of a primary color filter 404 according to the embodiment. As illustrated in FIG. 11, a total of 16 first pixels 4011-1 to 4011-16 which are arranged in a two dimensional shape of four rows and four columns are included in a first substrate 401. In addition, a total of 8 second pixels 4021-1 to 4021-8 which are arranged in a two dimensional shape of four rows and four columns are included in a second substrate 402. The light receiving area of each of the second pixels 4021-1 to 4021-8 is twice as large as the light receiving area of each of the first pixels 4011-1 to 4011-16. The number and the arrangement of the first pixels 4011 included in the first substrate 401 and the second pixels 4021 included in the second substrate 402 are not limited to the illustrated example, but may be any number and arrangement.

The complementary color filter 403 formed on the first substrate 401 is a filter in winch color filters M for transmitting magenta (M) (=B+R) light and color filters Y for transmitting yellow (Y) (=G+R) light are arranged. The color filters Y for transmitting yellow (Y) light are formed in the first pixels 4011-1, 4011-3, 4011-5, 4011-7, 4011-9, 4011-11, 4011-13 and 4011-15. The color filters M for transmitting magenta (M) light are formed in the first pixels 4011-2, 4011-4, 4011-6, 4011-8, 4011-4011-12, 4011-14, and 4011-16.

The primary color filter 404 formed on the second substrate 402 is a filter in which color filters R for transmitting red (R) light are arranged. The color filters R for transmitting red (R) light are formed in the second pixels 4021-1 to 4021-8.

In addition, the first pixels 4011-1 to 4011-16 included in the first substrate 401 and the second pixels 4021-1 to 4021-8 included in the second substrate 402 are disposed. to have a two-to-one correspondence relationship. For example, the first pixels 4011-1 and 4011-5 and the second pixel 4021-1 are disposed so that light transmitted through the first pixels 4011-1 and 4011-5 is emitted only to the corresponding second pixel 4021-1. in addition, the first pixels 4011-2 and 4011-6, and the second pixel 4021-2 are disposed so that light transmitted through the first pixels 4011-2 and 4011-6 is emitted only to the corresponding second pixel 4021-2. In the same manner, the first pixels 4011-3, 4011-4, 4011-7 to 4011-16 and the second pixels 4021-3 to 4021-8 are also disposed as illustrated in FIG. 11.

As described above, the light receiving area of each of the second pixels 4021-1 to 4021-8 is made to be twice as large as the light receiving area of each of the first pixels 4011-1 to 4011-16. This increases light receiving sensitivity of the second pixels 4021-1 to 4021-8 because a portion of the red (R) light transmitted through the first substrate 401 and emitted to the second substrate 402 is absorbed by the first substrate 401, and the amount of incident light per unit area emitted to the second substrate is reduced.

For example, when the thickness of the first substrate 401 is about 3 μm, the red (R) light emitted to the second substrate 402 is decreased to be about 15% of the red (R) light emitted to the first substrate 401. Therefore, when the amount of light emitted to the second pixel 4021 is reduced and the light receiving area of the second pixel 4021 is small, an SN ratio will be decreased.

In the embodiment, the light receiving area of each of the second pixels 4021-1 to 4021-8 is twice as large as the light receiving area of each of the first pixels 4011-1 to 4011-16. Accordingly the light receiving sensitivity of the second pixels 4021-1 to 4021-8 is increased, and the SN ratio can be increased.

Next, a method of calculating RGB color information by the signal processor 106 is the same as in the first embodiment. In the embodiment, since adjacent pixels obtaining missing color information at the time of performing demosaicing processing are increased in the same manner as in the first embodiment, color interpolation accuracy is improved. in addition, since the complementary color filter 403 is formed in the first pixel 4011, the sensitivity of the first pixel 4011 is a high sensitivity. Accordingly, the imaging element 400 of the embodiment can increase sensitivity and accuracy of color reproduction.

(Fifth Embodiment)

Next, a fifth embodiment of the present invention will be described. The embodiment is different from the first embodiment in that one set of a unit pixel region is configured of two pixels (horizontal× vertical: 1 pixel×2 pixels, or 2 pixels×1 pixel). The other configurations of an imaging element 500 in the embodiment are the same as the configurations of the imaging element 100 in the first embodiment.

Figure 12:
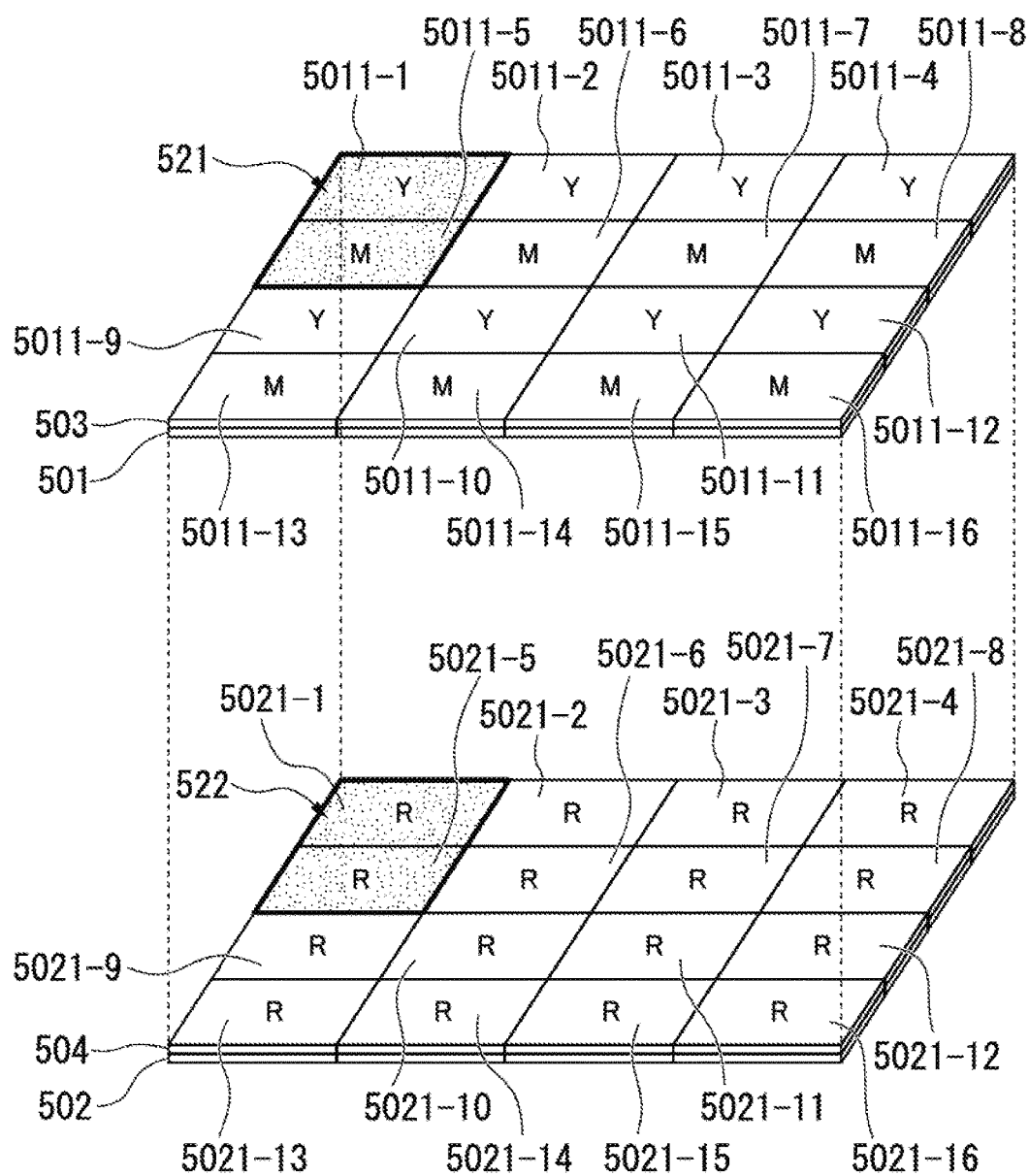
FIG. 12 is a schematic view illustrating the arrangement of a complementary color filter and the arrangement of a primary color filter according to a fifth embodiment of the present invention.
Figures 15, 16:
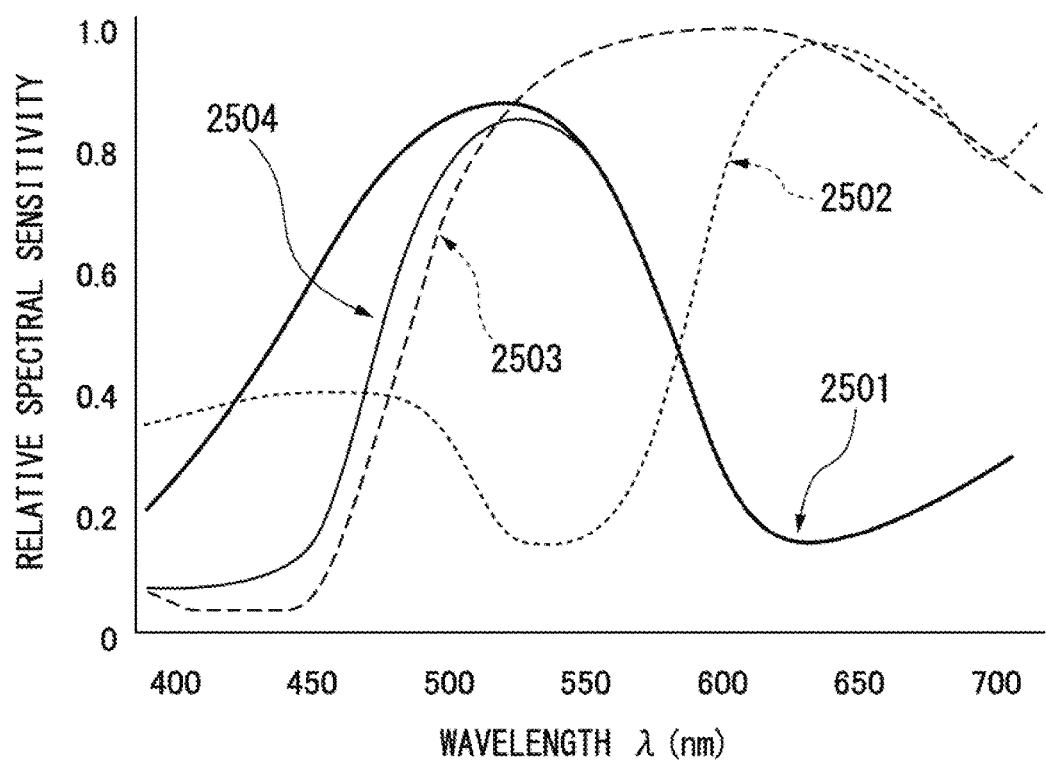
FIG. 15 is a graph showing the transmission characteristics of a color filter C, color filter M, a color filter Y and a color filter G known in the related art.
FIG. 16 is a schematic view illustrating an example of the transmittance f each color component of RGB transmitted through each color filter of CMYG known in the related art.

FIG. 12 is a schematic view illustrating the arrangement of a complementary color filter 503 and the arrangement of a primary color filter 504 according to the embodiment. In an illustrated example, a total of 16 first pixels 5011-1 to 5011-16 which are arranged in a two dimensional shape of four rows and four columns are included in a first substrate 501. In addition, a total of 16 second pixels 5021-1 to 5021-16 which are arranged in a two dimensional shape of four rows and four columns are included in a second substrate 502. The number and the arrangement of the first pixels 5011 included in the first substrate 501 and the second pixels 5021 included in the second substrate 502 are not limited to the illustrated example, but may be any number and arrangement.

The complementary color filter 503 formed on the first substrate 501 is a filter in which color filters M for transmitting magenta (M) (=B+R) light and color filters Y for transmitting yellow (Y) (=G+R) light are arranged. The color filters Y for transmitting yellow (Y) light are formed in the first pixels 5011-1 to 5011-4, and 5011-9 to 5011-12. The color filters M for transmitting magenta (M) light are formed in the first pixels 5011-5 to 5011-8, and 5011-13 to 5011-16.

In addition, two of the first pixels 5011 vertically adjacent to each other are set to be one set of a unit pixel region 521. For example, the set of the unit pixel region 521 is configured of one first pixel 5011-1 in which the color filter Y for transmitting yellow light is formed, and one first pixel 5011-5 in which the color filter M for transmitting magenta light is formed.

The primary color filter 504 formed on the second substrate 502 is a filter in which color filters R for transmitting red (R) light are arranged. The color filters R for transmitting red (R) light are formed in the second pixels 5021-1 to 5021-16.

In addition, two of the second pixels 5021 vertically adjacent to each other are set to be one set of a unit pixel region 522. For example, the set of the unit pixel region 522 is configured of two pixels 5021-1 and 5021-5 in which the color filters R for transmitting red light are formed.

In addition, the first pixels 5011-1 to 5011-16 included in the first substrate 501. and the second pixels 5021-1 to 5021-16 included in the second substrate 502 are disposed to have a one-to-one correspondence relationship with each other. For example, the first pixel 5011-1 and the second pixel 5021-1 are disposed so that light transmitted through the first pixel 5011-1 is emitted only to the corresponding second pixel 5021-1. fit addition, the first pixel 5011-2 and the second pixel 5021-2 are disposed so that light transmitted through the first pixel 5011-2 is emitted only to the corresponding second pixel 5021-2. In the same manner, the first pixels 5011-3 to 5011-16 and the second pixels 5021-3 to 5021-16 are also disposed as illustrated, As described in the first embodiment, it is possible to obtain all of the RGB color information in two of the first pixels 5011 adjacent to each other by forming the color filter M or the color filter Y in the first pixel 5011 on the first substrate 501 and forming the color filter R in the second pixel 5021 on the second substrate 502.

Accordingly it is possible to generate a full image of RGB by configuring the unit pixel region 521 using the two first pixels 5011 as in the embodiment, rather than configuring a unit pixel region using four pixels (two pixels×two pixels) vertically and horizontally adjacent to each other as in the arrangement of filter using a Bayer array or a color difference sequential system.

A method of calculating RGB color information by the signal processor 106 is the same as in the first embodiment. In addition, in the embodiment, since adjacent pixels obtaining missing color information are increased at the time of performing demosaicing processing in the same manner as in the first embodiment, color interpolation accuracy is improved. In addition, since the complementary color filter 503 is formed in the first pixel 5011, the sensitivity of the first pixel 5011 is a high sensitivity. Accordingly, it is possible to configure the imaging element 500 with high sensitivity and high accuracy of color reproduction, without configuring one set of a unit image region using four pixels.

While preferred embodiments of the invention have been described and illustrated above, it should be understood that these are exemplary of the invention and are not to be considered as limning. Additions, omissions, substitutions, and other modifications can be made without departing from the scope of the present invention. Accordingly, the invention is not to be considered as being limited by the foregoing description, and is only limited by the scope of the appended claims.

What is claimed is:

1. An imaging element comprising:
a first substrate;
a plurality of first light receiving elements which are regularly disposed on the first substrate and output a first signal corresponding to an intensity of emitted light;
a plurality of first color filters each of which is disposed on a light receiving surface of the first light receiving elements, and allow light in a first wavelength band including at least a second wavelength band and a third wavelength band to be transmitted;
a second substrate which is disposed so that light transmitted through the first substrate is emitted thereto;
a plurality of second light receiving elements which are regularly disposed on the second substrate and output a second signal corresponding to the intensity of the emitted light;

a plurality of second color filters each of which is disposed on a light receiving surface of the second light receiving elements, and allow light in the second wavelength band to be transmitted; and
a signal processor which generates a pixel signal corresponding to each of the plurality of first light receiving elements using the first signal and the second signal, wherein,
when the first wavelength band is a wavelength band of magenta (M) light in a CMY complementary color system with respect to an RGB color system, the third wavelength band is a wavelength band of blue (B) light in the RGB color system,
when the first wavelength band is a wavelength band of yellow (Y) light in the CMY complementary color system with respect to the RGB color system, the third wavelength band is a wavelength band of green (G) light in the RGB color system, and
the second wavelength band is a wavelength band of red (R) light in the RGB color system.

2. An imaging element comprising:
a first substrate;
a plurality of first light receiving elements which are regularly disposed on the first substrate and output a first signal corresponding to an intensity of emitted light;
a plurality of first color filters each of which is disposed on a light receiving surface of the first light receiving elements, and allow light in a first wavelength band including at least a second wavelength band and a third wavelength band to be transmitted;
a second substrate which is disposed so that light transmitted through the first substrate is emitted thereto;
a plurality of second light receiving elements which are regularly disposed on the second substrate and output a second signal corresponding to the intensity of the emitted light;
a plurality of second color filters each of which is disposed on a light receiving surface of the second light receiving elements, and allow light in the second wavelength band to be transmitted;
a signal processor which generates a pixel signal corresponding to each of the plurality of first light receiving elements using the first signal and the second signal;
a plurality of third light receiving elements which are regularly disposed on the first substrate and output a third signal corresponding to the intensity of emitted light;
a plurality of third color filters each of which is disposed on a light receiving surface of the third light receiving elements and allow light in a fourth wavelength band including at least a fifth wavelength band to be transmitted;
a plurality of fourth light receiving elements which are regularly disposed on the second substrate and output a fourth signal corresponding to the intensity of emitted light; and
a plurality of fourth color filters each of which is disposed on a light receiving surface of the fourth light receiving elements and allow light in the fifth wavelength band to be transmitted,
wherein the signal processor generates the pixel signal corresponding to each of the plurality of third light receiving elements using the third signal and the fourth signal.

3. The imaging element according to claim 2, wherein
the fourth wavelength band is a wavelength band of cyan (C) light or a wavelength band of yellow (Y) light in the CMY complementary color system with respect to the RGB color system, and
the fifth wavelength band is a wavelength band of green (G) light in the RGB color system.

4. The imaging element according to claim 2, wherein the fourth wavelength band is the same as the fifth wavelength band.

5. An imaging element comprising:
a first substrate;
a plurality of first light receiving elements which are regularly disposed on the first substrate and output a first signal corresponding to an intensity of emitted light;
a plurality of first color filters each of which is disposed on a light receiving surface of the first light receiving elements, and allow light in a first wavelength band including at least a second wavelength band and a third wavelength band to be transmitted;
a second substrate which is disposed so that light transmitted through the first substrate is emitted thereto;
a plurality of second light receiving elements which are regularly disposed on the second substrate and output a second signal corresponding to the intensity of the emitted light;
a plurality of second color filters each of which is disposed on a light receiving surface of the second light receiving elements, and allow light in the second wavelength band to be transmitted;
a signal processor which generates a pixel signal corresponding to each of the plurality of first light receiving elements using the first signal and the second signal, wherein
a light receiving area on the light receiving surface of the second light receiving elements is larger than a light receiving area on the light receiving surface of the first light receiving elements, and
the plurality of second light receiving elements are disposed in one-to-one correspondence with the plurality of first light receiving elements.

* * * * *